(12) United States Patent  
Shizukuishi

(10) Patent No.: US 9,634,060 B2  
(45) Date of Patent: Apr. 25, 2017

(54) STACKED SOLID-STATE IMAGE SENSOR AND IMAGING APPARATUS INCLUDING THE SAME

(71) Applicant: Makoto Shizukuishi, Sendai (JP)

(72) Inventor: Makoto Shizukuishi, Sendai (JP)

(*) Notice: Subject to any disclaimer, the term of this patent is extended or adjusted under 35 U.S.C. 154(b) by 29 days.

(21) Appl. No.: 14/186,778

(22) Filed: Feb. 21, 2014

(65) Prior Publication Data

US 2014/0240566 A1  Aug. 28, 2014

(30) Foreign Application Priority Data

Feb. 22, 2013  (JP) .................................. 2013-33593

(51) Int. Cl.
  *H01L 27/00*  (2006.01)
  *H01L 27/146*  (2006.01)
  *H04N 5/335*  (2011.01)

(52) U.S. Cl.
  CPC .... *H01L 27/1469* (2013.01); *H01L 27/14634* (2013.01); *H04N 5/335* (2013.01)

(58) Field of Classification Search
  CPC .......... H01L 27/1469; H01L 27/14634; H04N 5/335
  See application file for complete search history.

(56) References Cited

U.S. PATENT DOCUMENTS 5,807,791 A  9/1998  Bertin et al.
6,111,776 A * 8/2000  Russell .................... G06K 7/14
                                                      365/106
6,992,026 B2  1/2006  Fukuyo et al.
8,080,862 B2  12/2011  Kaskoun et al.
8,118,732 B2 * 2/2012  Banik ................ A61B 1/00059
                                                      600/117
2006/0050160 A1  3/2006  Suzuki et al.
2010/0165368 A1 * 7/2010  Matsuoka ............... H04N 1/401
                                                      358/1.9

(Continued)

FOREIGN PATENT DOCUMENTS

JP    H02-008817 A   4/1985
JP    S60-068767 A   4/1985

(Continued)

OTHER PUBLICATIONS

Machine translation of JP 2009-170448, part of Applicant's IDS.*

*Primary Examiner* — Kimberly Rizkallah
*Assistant Examiner* — Alexander Belousov
(74) *Attorney, Agent, or Firm* — Harness, Dickey & Pierce, P.L.C.

(57) ABSTRACT

An image sensor includes a first semiconductor chip having a first surface and a second surface, the first semiconductor chip a including an array of unit pixels configured to capture light corresponding to an image and to generate image signals based on the captured light; and a second semiconductor chip having a first surface and a second surface, the second semiconductor chip including first peripheral circuits configured to control the array of pixels and receive the generated image signals, the first peripheral circuits including a vertical scanning circuit, a horizontal scanning circuit, and a signal read-out circuit, the first semiconductor chip being stacked on the second semiconductor chip, the first semiconductor chip not being smaller than the second semiconductor chip.

22 Claims, 15 Drawing Sheets

(56) References Cited

U.S. PATENT DOCUMENTS

2012/0056251 A1    3/2012  Kudoh
2012/0262198 A1   10/2012  Riho
2013/0092820 A1    4/2013  Takemoto

FOREIGN PATENT DOCUMENTS

| | | |
|---|---|---|
| JP | S61-12856 A | 6/1986 |
| JP | S63-181369 A | 7/1988 |
| JP | H07-245386 A | 9/1995 |
| JP | H08-064556 A | 3/1996 |
| JP | H10-093061 A | 4/1998 |
| JP | H10-224696 A | 8/1998 |
| JP | H11-261044 A | 9/1999 |
| JP | 2000-278605 A | 10/2000 |
| JP | 2001-339057 A | 12/2001 |
| JP | 2002-090462 A | 3/2002 |
| JP | 2002-192370 A | 7/2002 |
| JP | 2002-344809 A | 11/2002 |
| JP | 2003-078827 A | 3/2003 |
| JP | 2004-146816 A | 5/2004 |
| JP | 2004-172228 A | 6/2004 |
| JP | 2006-049361 A | 2/2006 |
| JP | 2007-124288 A | 5/2007 |
| JP | 2009-170448 A | 7/2009 |
| JP | 2010-0273757 A | 12/2010 |
| JP | 2012-054450 A | 3/2012 |
| JP | 2012-104684 A | 5/2012 |
| JP | 2013-051674 A | 3/2013 |
| JP | 2013-080838 A | 5/2013 |
| JP | 2013-090127 A | 5/2013 |
| WO | WO-2006-112320 A1 | 10/2006 |

\* cited by examiner

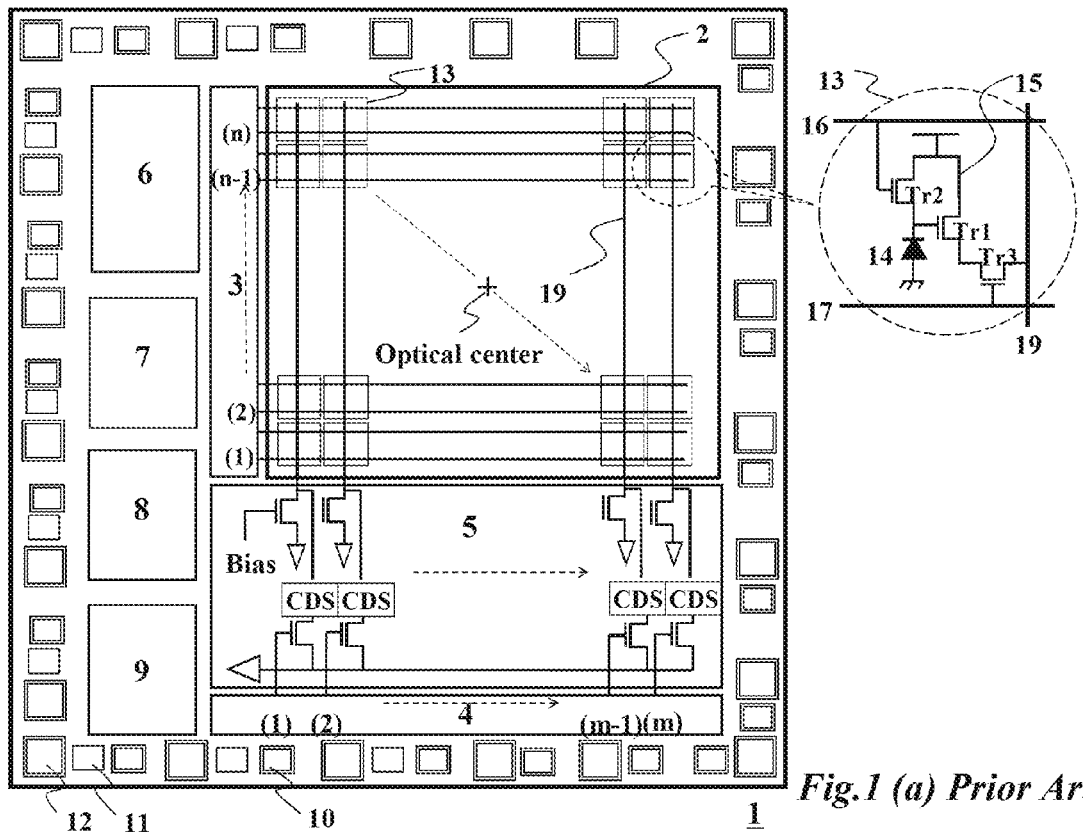
*Fig.1 (a) Prior Art*
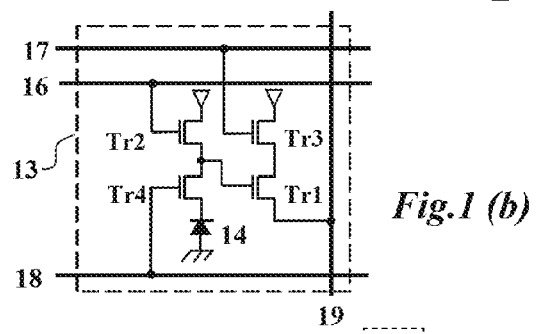
*Fig.1 (b) Prior Art*
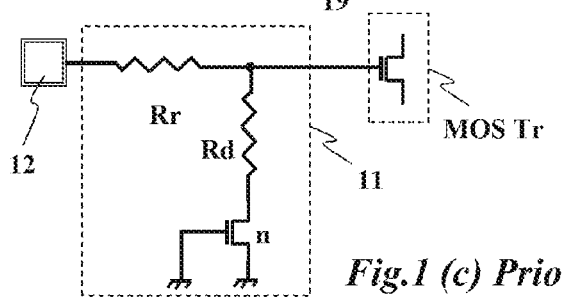
*Fig.1 (c) Prior Art*

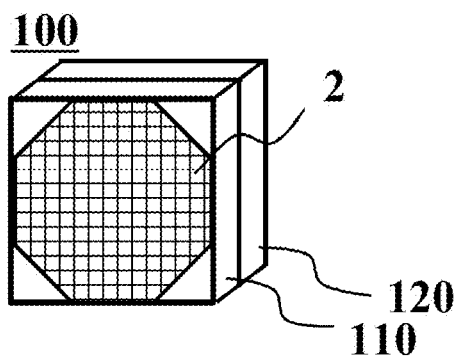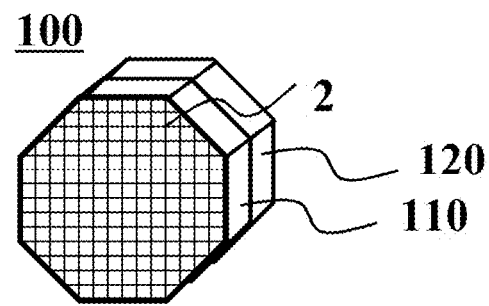
*Fig.8(a)* *Fig.8(b)*

Focused Image

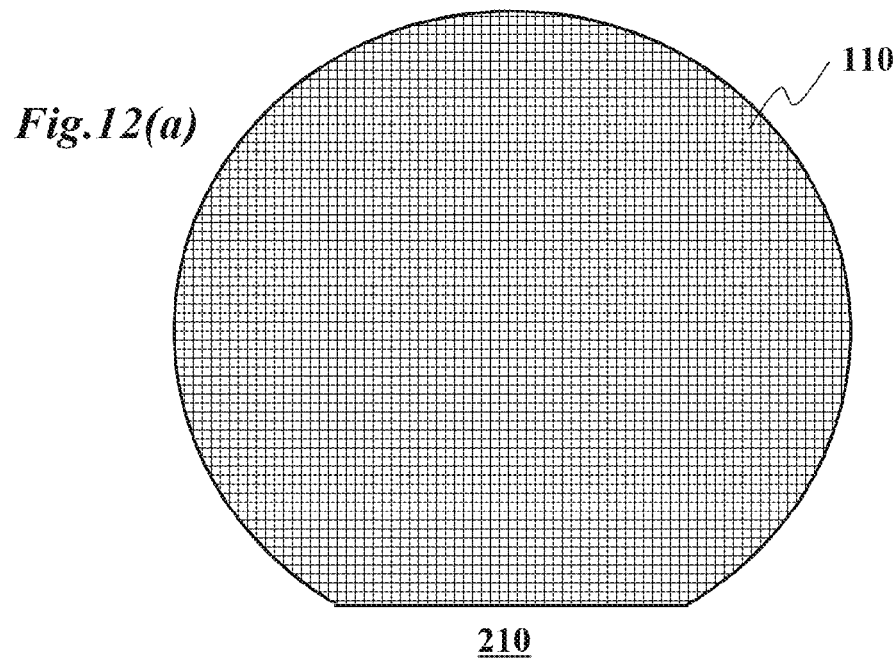
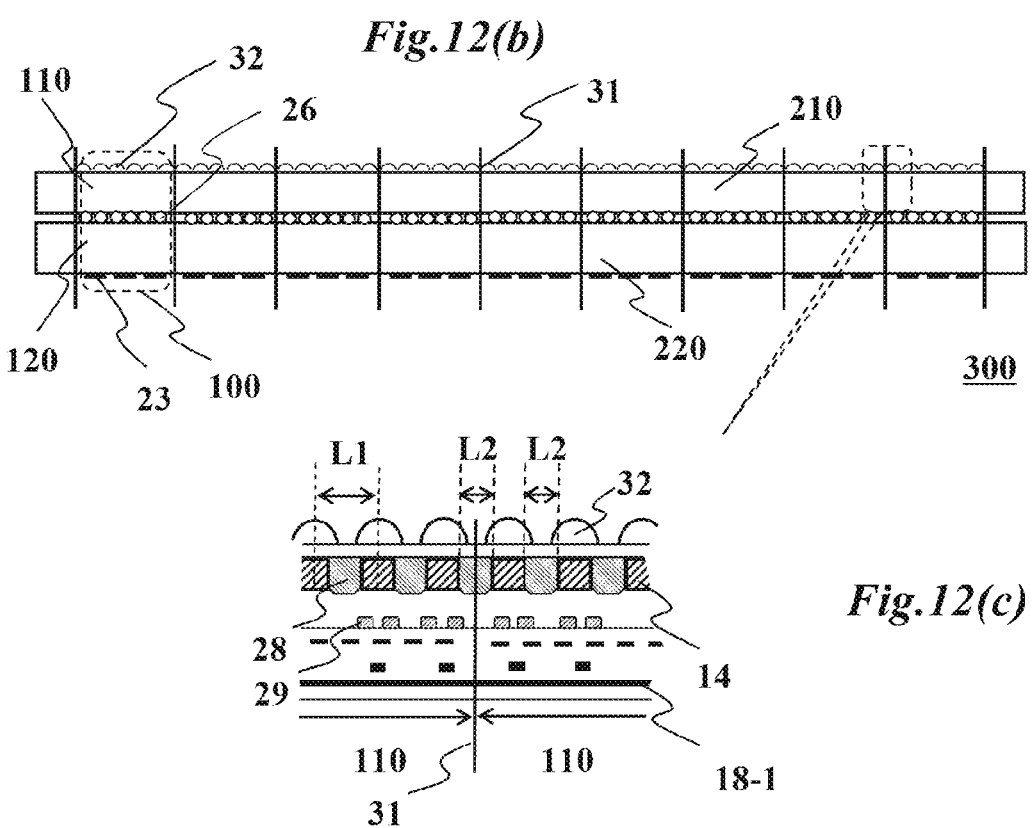

STACKED SOLID-STATE IMAGE SENSOR AND IMAGING APPARATUS INCLUDING THE SAME

CROSS-REFERENCE TO RELATED APPLICATION

This application claims priority under 35 U.S.C. §119 to Japanese Patent Application No. 2013-033593 filed on Feb. 22, 2013, in the Japanese Patent Office (JPO), the entire contents of which are incorporated herein by reference.

BACKGROUND

1. Technical Field

Example embodiments relate to a small form factor solid state image sensor, a method of manufacturing the same, and an imaging apparatus.

2. Related Art

Types of solid-state image sensors that are used for various electronic imaging apparatus like video and still cameras include, for example, a charge-coupled device (CCD) type sensor and a metal-oxide semiconductor (MOS) type sensor. Previously, CCD sensors generally had better sensitivity and image quality than the MOS sensors. However, CCD sensors may require a customized CCD manufacturing process and an additional support device like a driver IC on a circuit board. Further CCD sensors may consume a larger amount of electric power compared to MOS sensors. MOS sensors using complementary MOS (CMOS) technology may consume less power than CCD sensors, and may be manufactured by widely used MOS wafer process.

Solid-state image sensors may also be applied to medical instruments in order to discover a disease or other condition harmful to the health of a patient in the early stages of the condition thereby reducing medical expenses. In these applications, other functionalities, performance and form factors besides sensitivity and image quality should be considered. An endoscope, for example, may require a high image quality solid-state image sensor with a small footprint, which will limit an amount of pain experienced by a patient undergoing endoscopy. However, it may be difficult for the conventional solid-state image sensor to realize a small form factor because of the photo-insensitive portion (dead space) which surrounds an image sensing area on the image sensor. As the dead space increases for a sensor having an image sensing area of a constant size, the diameter of an endoscope-probe may increase.

FIG. 1 (a) shows a prior art MOS sensor. On the MOS sensor 1, a vertical scanning circuit 3, a horizontal scanning circuit 4, and a signal read-out circuit 5 are formed around a rectangular image sensing area 2. A timing pulse generation circuit 6, an analog to digital converter (ADC) circuit 7, a digital image processing circuit 8, and an interface circuit (I/F) 9 are formed on the same MOS sensor 1. The signal read-out circuit 5 includes one or more correlated double sampling circuits CDS to reduce signal noise, for example. Input and/or output buffer circuits 10 and input protection circuits 11 accompanying a contact pad 12 are also integrated on the periphery of the MOS sensor chip 1.

The image sensing area 2 is formed by an array of unit pixels 13. The array includes m pixels horizontally by n pixels vertically. The unit pixel 13 includes optoelectronic conversion device including, for example, a pn-junction photo-diode and a MOS transistor circuit. The unit pixel 13 includes a photo-diode (PD) 14 and the MOS transistor circuit includes an amplifying transistor Tr1, a reset transistor Tr2, and a select transistor Tr3 as shown in the partially enlarged portion of figure of FIG. 1 (a) illustrated in a dashed-line circle. By controlling the reset signal line 16 and the select signal 17, charges stored in the photo-diode 14 are read out through the signal line 19. The signal lines 16 and 17 are connected to, and controlled by, the vertical scanning circuit 3. The signal line 19 connects to the signal read-out circuit 5. Another configuration of the unit pixel 13 is shown in FIG. 1 (b). A charge read transistor Tr4 is formed between the photo-diode 14 and the reset transistor Tr2. The gate electrode of the read transistor Tr4 is connected to the read control signal line 18.

Two types of wiring are defined. One type of wiring is local wiring which runs inside the pixel including, for example, the wiring 15, as shown in FIG. 1 (a). The other type of wiring is global wiring which runs over multiple pixels or across the image sensing area 2. Examples of global wiring include lines 16, 17, 18, and 19. An equivalent circuit diagram of the input protection circuit 11 is shown in FIG. 1 (c). Input protection circuit 11, for example, includes a gate-grounded n-MOS transistor utilizing avalanche-breakdown phenomenon. Input protection circuit 11 includes a series resistor Rr of 3K Ohms and a parallel resistor Rd of 1K to 10K Ohms which limit maximum peak electrical current flow through these components to protect the gate oxide from the electro-static discharge at the gate input terminal of the MOS transistor MOS Tr.

The vertical scanning circuit 3, the horizontal scanning circuit 4 and the signal read-out circuit 5 are located next to vertical and horizontal sides of the image sensing area 2, respectively, which causes misalignment between the center positions of the MOS sensor 1 and the center position of the image sensing area 2 (marked by '+'). The alignment of the lens optics with the image sensing area 2 is carefully adjusted to reduce such a misalignment between the center positions of lens optics and image sensing area 2. As used herein, the term 'image sensing area' refers to an array of unit pixels. Peripheral circuits and isolation areas in between light-sensitive elements of unit pixels are not light-sensitive. However, though isolation areas in between pixels of the image sensing area 2 are not light-sensitive, as used herein, the term 'dead space' refers to peripheral circuits and I/O components including an input protector outside of image sensing area 2, and the term 'dead space' does not refer to an isolation area between the pixels of the image sensing area 2. Examples of peripheral circuits that are dead space include the vertical scanning circuit 3, the horizontal scanning circuit 4, the signal read-out circuit 5 and other peripheral circuits including a timing pulse generation circuit 6, an AD converter circuit 7, a digital image processing circuit 8, an interface circuit 9, input and/or output buffer circuits 10, input protection circuits 11, and contact pads 12.

The diagonal length of the image sensing area (the effective image size) used for a mobile-phone and a digital camera is about ⅙ to ½ inch. The effective image size used for medical instruments like an endoscope is about 1/10 inch and still further size reduction may be desirable. As the size of the MOS sensor is decreased, the area of the dead space may become dominant over the area of the image sensing area because the area for the input and/or output buffer circuits, input protection circuits and contact pads are not necessarily proportional to the area for the image sensing area. Consequently, if a surface area of an image sensor is reduced by a certain percentage without reducing a number of pixels, a surface area of an image sensing portion of the chip (e.g., pixel sizes) may become reduced by an even greater percentage. One solution may be to reduce the number of pixels in the image sensor. However, in either case, image qualities such as image resolution or optical sensitivity may be degraded.

The following is a numerical estimation of the dead space versus the image sensing area on a conventional MOS sensor. The estimation is depending on a circuit design rule, fabrication technology and other conditions including a pixel size of the MOS sensor and total number of pixels on the chip. In the case of a 5 mega-pixel, ⅓ inch MOS sensor with a pixel size of 2 square micron-meters, for example, the image sensing area is about 22 mm². Considering a chip size of 56 mm², the dead space is approximately 34 mm², which is larger than the image sensing area of 22 mm². For example, in the conventional example above, the image sensing area is around 40% of the total area of the face of the chip while the dead space is around 60% of the total area of the face of the chip.

A stacked or three dimensional (3D) sensor structure has been developed. The size of the second semiconductor chip is, however, larger than the first semiconductor chip. For example, in the conventional example provided above, if the dead space portion of the chip, excluding the input and output buffer and input protection circuits, were removed and placed on a second chip, the second chip would have a size of 30 mm² while the first chip would have a size of only 22 mm². Consequently, the second chip would be around 36% larger than the first chip.

As for the stacked sensor structure, input protection circuits may be required for each input terminal between the chips in addition to externally exposed input terminals, otherwise MOS transistor input gate insulating material may be damaged from an electro-static discharge (ESD).

The external form of the MOS sensor and the image sensing area are rectangles or squares same as other semiconductor chips including, for example, memory and logic ICs. An optical image formed through the lens system is neither a rectangle nor a square but a circle. The MOS sensor having a diagonal length that is the same as the above-referenced optical circle would not cover the entire optical image. In an alternative case where a larger MOS sensor is used that has an image sensing area that covers an entirety of a projected circle image corresponding to the above-referenced optical circle, the image sensing area of the four corners of the larger MOS sensor are outside the projected image and not utilized for image sensing.

The horizontal scanning circuits and vertical scanning circuit that are composed of a series of unit circuits including, for example, a shift register circuit, are arranged in a row and column direction so as to be aligned with the arrangement of pixels in horizontal and vertical directions respectively. In the stacked type sensor, however, peripheral circuits like the horizontal and the vertical scanning circuits are integrated on the second semiconductor chip. Further, according to example embodiments, control signal lines to, and output signal lines from, each pixel may be routed between the first and second semiconductor chips.

As is shown in FIG. 1 (a), the vertical scanning circuit may have a series of shift registers which correspond to each horizontal global wiring outside of the image sensing area. Straight and same pitch global lines may be routed with the pixel array, and such routing which may suppress fixed pattern noise due to signal delay non-uniformity. With respect to a stacked structure, the first semiconductor chip may be layered on the larger size of the second semiconductor chip in order to keep the above-mentioned same routing pitch of the global lines or shift register layout pattern. The MOS sensor size, in such a case, may be dependent on the larger size of the second semiconductor chip.

SUMMARY

Example embodiments provide a MOS sensor that is capable of preventing the dead space on the sensor surface. Example embodiments further provide, advantageously small form factor imaging apparatus that are provided with such a MOS sensor having optical symmetry. In addition, example embodiments further provide a MOS sensor that is capable of preventing electro-static discharge breakdown of the MOS structure, and a manufacturing method thereof.

According to example embodiments, an image sensor may include a first semiconductor chip having a first surface and a second surface, the first semiconductor chip including an array of unit pixel configured to capture light corresponding to an image and to generate image signals based on the captured light, the array of unit pixels forming an image sensing area on the first surface of the first semiconductor chip; and a second semiconductor chip having a first surface and a second surface, the second semiconductor chip including first peripheral circuits configured to control the array of pixels and receive the generated image signals, the first peripheral circuits including a vertical scanning circuit, a horizontal scanning circuit, and a signal read-out circuit, the first semiconductor chip being stacked on the second semiconductor chip such that the second surface of the first semiconductor chip faces the second surface of the second semiconductor chip, the first semiconductor chip not being smaller than the second semiconductor chip.

According to example embodiments, the first semiconductor chip may include an image sensing area including an array of pixels. According to example embodiments, the image sensing area may include only unit pixels, and the first semiconductor chip may be formed such that the first surface of first semiconductor chip includes only the image sensing area, and no peripheral circuits, where the first surface is the light-receiving surface of the first semiconductor chip. Consequently, a footprint of the image sensor according to example embodiments may be smaller than a foot print of a conventional image sensor having an image sensing area of the same size, due to the image sensing area of the image sensor according to example embodiments having no dead space dedicated to peripheral circuits, unlike the image sensing area of the conventional image sensor which includes dead space in the form of peripheral circuits. Examples of peripheral circuits that are dead space and may excluded from the entirety of the image sensing area of the image sensor according to example embodiments include a vertical scanning circuit, a horizontal scanning circuit, a signal read-out circuit and other peripheral circuits including a timing pulse generation circuit, an AD converter circuit, a digital image processing circuit, an interface circuit, an input and/or output buffer circuit, an input protection circuit, and contact pad.

According to example embodiments, a method of manufacturing an image sensor may include forming global wiring across a first semiconductor wafer, the first semiconductor wafer including a plurality of first semiconductor chips; for each of one or more of the plurality of first semiconductor chips, forming at least one of a shunt wiring and input protection circuit on a periphery of the first semiconductor wafer such that the global wiring is connected to the shunt wiring or the input protection circuit; forming a stacked wafer structure by stacking the first semiconductor wafer on a second semiconductor wafer, the second semiconductor wafer including a plurality of second semiconductor chips; and separating the stacked wafer structure into one or more image sensors by dicing the stacked wafer structure such that each of the one or more image sensors includes one or more of the first semiconductor chips stacked on an equal number of the second semiconductor chips, the dicing including cutting the global wiring between the first semiconductor chips on the first semiconductor wafer.

According to example embodiments, a method for manufacturing an image sensor may include forming polishing areas on each of a plurality of first semiconductor chips including in a first semiconductor wafer; forming polishing areas on each of a plurality of second semiconductor chips including in a second semiconductor wafer; forming a stacked wafer structure by stacking the first semiconductor wafer on a second semiconductor wafer; separating the stacked wafer structure into one or more image sensors by dicing the stacked wafer structure such that each of the one or more image sensors includes one of the first semiconductor chips stacked on one of the second semiconductor chips; and performing a polishing operation on the polishing areas of the first and second semiconductor chips of each of the one or more image sensors, the polishing operation being at least one of a mechanical polishing operation and a chemical polishing operation.

Example embodiments provide a MOS sensor having stacked structure of two same size semiconductor chips; an image sensing area as a detector of two dimensional image information is formed on a first surface of the first semiconductor chip and pixel circuits connecting with global wiring are formed on a second surface of the first semiconductor chip; a vertical scanning circuit, a horizontal scanning circuit, a read-out circuit and other peripheral circuits are formed on a second surface of the second semiconductor chip, and external input and output terminals are formed on a first surface of the second semiconductor chip which are electrically connected with the circuits formed on a second surface of the second semiconductor chip by a through silicon via (TSV); each second surface of the semiconductors has electrical contact between the stacked two semiconductor chips; in a plan perspective view, a vertical scanning circuit, a horizontal scanning circuit, a read-out circuit and other peripheral circuits are located inside an image sensing area formed above the second semiconductor chip.

According to example embodiments, a long side of the vertical scanning circuit block is, for example, parallel to a long side of the horizontal scanning circuit block on the second surface of the second semiconductor chip. Moreover, in a plan perspective view, each line included in first global wiring intersects at, for example, right angles with each line included in second global wiring. Each line included in the second global wiring is electrically connected to each line included third global wiring at, for example, right angles. As a result, each line of the first global wiring is, for example, parallel to each line of the third wiring group. In other words, the second global wiring changes direction from 90 degree to become, for example, parallel to the first wiring group. The first wiring is a set of horizontal global lines and the second global wiring is a set of vertical global lines and vice versa. Though right-angle and parallel arrangements of global wiring are discussed above as examples, example embodiments are not limited to parallel or right angle arrangements, and other angles may be used to arrange the global wiring In the configuration described above, the dead space may be reduced, and the image sensing area can be increased on the first surface of the first semiconductor chip. Due to increased pixel size, an MOS image sensor according to example embodiments may have increased sensitivity when compared with a conventional MOS image sensor having a same chip size and total number of pixels as the MOS image sensor according to example embodiments. Moreover, external input and output terminals may be formed on the first surface of the second semiconductor chip in order to reduce the size of the second semiconductor chip, which may make it easier for the second semiconductor chip to be the same size as that of the first semiconductor chip. According to example embodiments, the first semiconductor chip may be stacked on the same size second semiconductor chip, which may make the MOS sensor size smaller.

According to example embodiments, lines of the third global wiring may be formed so as to connect with lines of the second global wiring which are connected to either a horizontal or a vertical circuit which longitudinal direction is shorter than that of the other. With such a configuration, it may not be necessary for one of the horizontal or vertical circuit longitudinal directions to be shortened. The arrangement pitch of unit circuits and the pixel pitch may be un-changed because the horizontal circuit may be, for example, parallel to the vertical circuit.

According to example embodiments, lines of the third global wiring may be connected to the vertical scanning circuit. With such a configuration, the first global wiring is directly connected to the signal read-out circuit without extending each signal line and increasing each line load.

According to example embodiments, the size of the vertical scanning circuit, in a longitudinal direction, may be enlarged up to that of the horizontal scanning circuit. With this configuration, there may be more space between lines of the third wiring.

According to example embodiments, the signal read-out circuit may be located in the middle region of the image sensing area, in a plan perspective view. With such a configuration, the input terminals on the signal read-out circuit may be connected to the center of each global wiring formed on the second surface of the first semiconductor chip. Such a configuration may result in lower image shading observed in the re-produced image because of the reduction of line load among the pixels, in comparison with the prior configuration such as the input terminals placed at around the end of the signal lines or global wiring.

It is preferable that the first semiconductor chip and the second semiconductor chip of a MOS sensor are in the shape of a square or rectangle; in which blank areas such as no electrical components are formed near their corners. These blank areas are rounded off by polishing or grinding after a wafer dicing process. The stacked MOS sensor can take different shapes including, for example, a shape of column, pillar or polygon. With such a configuration, one or more corners of a MOS sensor periphery may be polished away to fit each given space for a MOS sensor to be mounted. Consequently, an imaging system using such a MOS sensor according to example embodiments may become smaller and more compact.

According to example embodiments, circuits on the second semiconductor chip may be arranged such that longer sides of a vertical scanning circuit, a horizontal scanning circuit, a signal read-out circuit, and an interface circuit are, for example, parallel to one another. According to example embodiments, a timing pulse generation circuit, a digital image processing circuit, and an interface circuit may be formed on the first surface of the third semiconductor chip on which the second semiconductor chip is stacked, and not on the first chip. According to example embodiments, with such a configuration, the second semiconductor chip size may not exceed the first semiconductor chip size under the condition of even smaller chip size. Consequently, an imaging system using such a MOS sensor may become even smaller and more compact.

According to example embodiments, lines of global wiring associated with the control signals on the first surface of the first semiconductor chip may extend to both ends of the first semiconductor chip. According to example embodiments, with such a configuration, gate oxides under a MOS gate electrode of the first semiconductor chip may be protected against the electro-static discharge ESD phenomena on the first semiconductor wafer before a wafer dicing process because the global wiring on the chip is connected with global wiring of other chips including ground or power lines.

According to example embodiments, the width of the device isolation at the end of the image sensing area may be one half that of the device isolation in an interior of the image sensing area. With such a configuration, pixel information may be successively and regularly detected, where pixel sampling points may be distributed uniformly among two or more MOS sensors tiled side by side.

According to example embodiments, a method is presented for manufacturing a stacked MOS sensor having a small form factor and ESD protection capability. Further, the front-end process of the first semiconductor wafer may include a process step of forming the global wiring which extends across the dicing line to shunt wiring or an input protection circuit near the periphery of the wafer substrate.

Consequently, first semiconductor chips without input protection circuits may not be exposed to ESD. As a result, a production yield and device reliability associated with the first semiconductor chips may also be improved.

Further, according to example embodiments, one or more first semiconductor chips may be formed in array without additional scribe or dicing space between the chips, where global wiring for control signals is distributed on the first semiconductor chips extending to the periphery of the wafer. With such a method, dicing line locations may be in the middle of the isolation area between the pixels, and therefore, the size of the first semiconductor chip may be configurable without regard to a pre-determined chip size or a photo-mask design. Consequently, the isolation width at the edge of the image sensing area on the second surface of the first semiconductor may be one half of that inside of the image sensing area. Moreover, various chip sizes or pixel numbers of the first semiconductor chips may be fabricated from one wafer changing the number of dicing lines, and a higher yield of the first semiconductor chips from one first semiconductor wafer may be realized as a result of the dicing space less structure.

According to example embodiments, the front-end process of the first semiconductor wafer may further include a process step of forming a polishing area near the corner of the first semiconductor chip and a process step of polishing the polishing area to make the corner round.

An endoscope system having a camera probe using a MOS sensor in accordance with example embodiments is disclosed. With such a configuration, a diameter of the probe may be thinned, and thus, a patient may experience less pain during examinations involving the endoscope.

A capsule-endoscope system using a MOS sensor in accordance with example embodiments is disclosed. With such a configuration, a diameter of the capsule is thinned, which results not only the less pain for the patient, but also a reduction in a cost of the disposable capsule itself.

Though endoscope related applications are provided above as examples, the image sensor according to example embodiments may be applied to any medical device or any device for which an image sensor having smaller size as a result of a reduced footprint is desirable.

An imaging system using tiled multiple MOS sensors in accordance with example embodiments is disclosed. With such a configuration, an entire image sensing area may be enlarged while reducing, or alternatively, eliminating missing pixel information between the chips. For example, according to example embodiments, there are multiple MOS sensors configured to be used by insertion into a patient's body. Further, according to example embodiments, MOS sensors are tiled to enlarge total imaging area near or including an area of the patient's body that is of interest to a diagnostician. Consequently, a need to perform a surgical operation to view the same area may be reduced.

Without integrating peripheral circuits like scanning circuits and bonding pads around the image sensing area on the first semiconductor chip, the center position of the image sensing area can be close to that of the image projected through the lens. Consequently, the imaging module including the optical system may be relatively smaller and more compact. Further, for some applications, the shape of the image sensing area is not limited to a square or a rectangle, but rather, an image sensing area in a shape of a polygon, a polygon having more than 4 sides, a polygon having rounded edges, an oval or a circle may be introduced depending on particular application requirements. According to example embodiments, a MOS sensor can be made smaller without deteriorating captured image quality. Consequently, imaging systems such as a medical endoscope using a disclosed MOS sensor relieves a test subject's pain.

Further, MOS gate electrodes are connected to shunt wiring or input protection circuits by the global wiring on the first semiconductor wafer before the wafer dicing, which prevents MOS gate insulating material from ESD failure and improve their production yield. In addition, a number of dicing lines on the wafer is increased as a MOS sensor chip size becomes smaller, which means that the production yield is dominated by the dicing space. Then the total numbers of chips obtained from a wafer are increased with reducing dicing space, which makes the chip cost lower and affordable for a disposable capsule endoscope, for example.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 1 (*a*) is a plan view of a prior art that schematically illustrates a MOS sensor equivalent circuit diagram and its enlarged pixel circuit with three transistors.

FIG. 1 (*b*) is a plan view of a prior art that schematically illustrates a MOS sensor pixel circuit with four transistors.

FIG. 1 (*c*) is a plan view of a prior art that schematically illustrates an equivalent circuit diagram of an input protector.

FIG. 2 (b) is a plan view that schematically illustrates an example of global wiring layout and array of pixels on a first semiconductor chip according to at least one example embodiment.

FIG. 2 (c) is a plan view that schematically illustrates an example of circuit block layout on a second semiconductor chip according to at least one example embodiment.

FIG. 3 (b) is a cross sectional view of FIGS. 2 (b) and (c) taken along line B-B.'

FIG. 3 (c) is a plan view that schematically illustrates an example of a layout of external input and output terminals on a first surface of a second semiconductor chip according to at least one example embodiment.

FIG. 4 (b) is a plan view that schematically illustrates an example of circuit block layout on a second semiconductor chip according to at least one example embodiment.

FIG. 5 (b) is a cross sectional view of FIG. 5 (a) taken along lines A-A.'

FIG. 6 (b) is a plan view that schematically illustrates an example of circuit block layout on a second semiconductor chip according to at least one example embodiment.

FIG. 6 (c) is a plan view of a four pixel structure with a common source follower amplifier circuit used in at least one example embodiment.

FIG. 7 (b) is a plan view that schematically illustrates an example of circuit block layout on a second semiconductor chip according to at least one example embodiment.

FIG. 8 (a) is a perspective view that schematically illustrates an example of the configuration of a MOS sensor before corner polishing according to at least one example embodiment.

FIG. 8 (b) is a perspective view that schematically illustrates an example of the configuration of a MOS sensor after corner polishing according to at least one example embodiment.

FIG. 9 (b) is a plan view that schematically illustrates an example of circuit block layout on a second semiconductor chip according to at least one example embodiment.

FIG. 10 (b) is a plan view that schematically illustrates an example of a pixel array on a first surface of a first semiconductor chip according to at least one example embodiment.

FIG. 10 (c) is a plan view that schematically illustrates an example of circuit block layout on a second semiconductor chip according to at least one example embodiment.

FIG. 11 (b) is a plan view that schematically illustrates an example of a first semiconductor chip layout on a first silicon wafer according to at least one example embodiment.

FIG. 11 (c) is an enlarged plan view of a part of the silicon wafer as illustrated in FIG. 11 (b).

FIG. 11 (d) is an enlarged cross sectional view of a part of the boundary between two first semiconductor chips as illustrated in FIG. 11 (c).

FIG. 12 (a) is a plan view that schematically illustrates an example of a first semiconductor chip layout on a first silicon wafer according to at least one example embodiment.

FIG. 12 (b) is a cross sectional view that schematically illustrates an example of a first semiconductor wafer on a second semiconductor wafer according to at least one example embodiment.

FIG. 12 (c) is an enlarged cross sectional view of a part of the first semiconductor wafer as illustrated in FIG. 12 (b) according to at least one example embodiment.

DETAILED DESCRIPTION OF EXAMPLE EMBODIMENTS

Figure 2A:
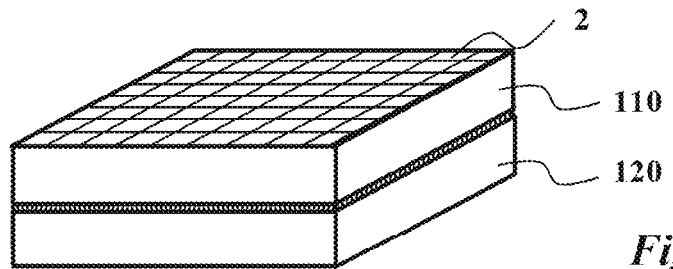
FIG. 2 (a) is a perspective view that schematically illustrates an example of the configuration of a MOS sensor according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected to", "coupled to", or "on" another element, it may be directly connected to, directly coupled to, or directly on the other element, or intervening elements may be present. In contrast, when an element is referred to as being "directly connected to", "directly coupled to", or "directly on" another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

As is discussed above, a conventional MOS sensor may include dead space. By reducing the dead space on the sensor surface, the center positions of the MOS sensor will be close to or aligned with the center position of the image sensing area. Accordingly, an imaging system using such a device with lens optics may be realized in a form that is smaller than that of an imaging system using the conventional MOS sensor.

Further, as is stated above, a stacked or three dimensional (3D) sensor structure has been developed in which the size of the second semiconductor chip is larger than the first semiconductor chip. However, with respect to the endoscope application, or other medical device application where a reduced form factor is preferable, according to example embodiments, the size of the first semiconductor chip may be the same as that of the second semiconductor chip to make the endoscope-probe or other medical device thinner.

With reference to the accompanying drawings, a MOS sensor having for example, little or, alternatively, no dead space on its top surface according to at least one example embodiment is described below. FIG. 2(a) is a perspective view of a MOS sensor 100, which comprises a first semiconductor chip 110 on a second semiconductor chip 120 of same chip size. The first semiconductor chip 110 has an image sensing area 2 on the first surface of the first semiconductor chip 110. An array of pixel read-out circuits (which is not shown in this figure) may be formed on the second surface of the first semiconductor chip 110. The pixel read-out circuits may convert incident light signals, including for example photons, generated at the first surface of the first semiconductor chip 110 into electrical signals. External input and output terminals (which are not shown in this figure) may be formed on the bottom of the MOS sensor with a first surface of the second semiconductor chip 120. According to example embodiments, peripheral circuits including a vertical scanning circuit 3, a horizontal scanning circuit 4, a signal read-out circuit 5, a timing pulse generation circuit 6, an AD converter circuit 7, a digital image processing circuit 8, an interface circuit 9, input and/or output buffer circuits 10, input protection circuits 11, and contact pads 12 are formed on the second surface of the second semiconductor chip, and are not formed on the first surface of the first chip 110. The first semiconductor chip 110 is stacked on the second semiconductor chip 120, where one second surface of a semiconductor chip faces to the other second surface of the semiconductor chip. As shown below in detail, peripheral circuits, and external input and output terminals are placed under the image sensing area 2. According to example embodiments, the first semiconductor chip 110 may be formed to include only the image sensing area 2, or, alternatively, the first semiconductor chip 110 may be formed to include only the image sensing area 2 and a dicing or scribe margin surrounding the image sensing area 2. Further, the image sensing area 2 may be formed to include only unit pixels 13 and the isolation area 28 that separates the unit pixels 13 such that the image sensing area 2 includes none of the peripheral circuits. According to example embodiments, the first semiconductor chip 110 may be formed to include none of the peripheral circuits.

Figure 2B:
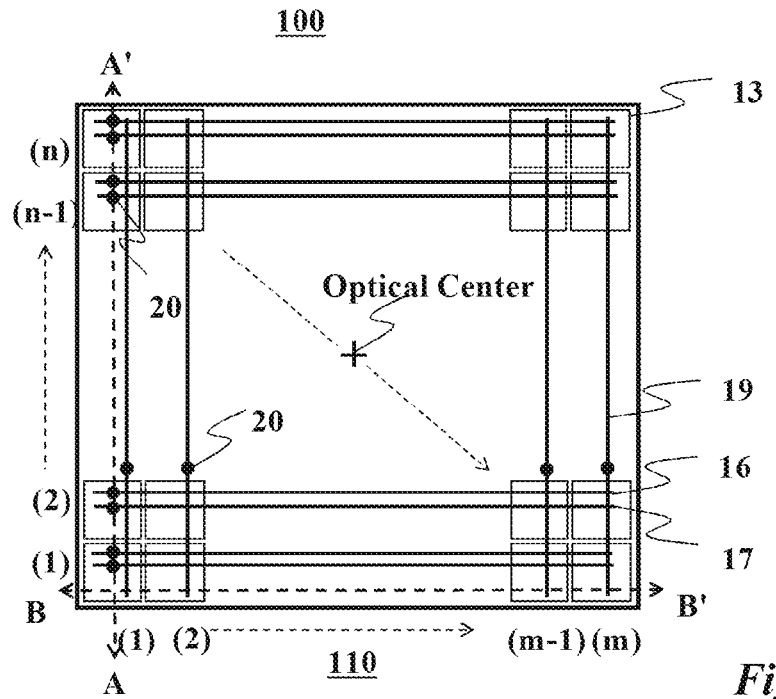

FIG. 2(b) is a plan view of the second surface of the first semiconductor chip 110 according to example embodiments. An image sensing area 2 includes an array of pixels having the structure of the unit pixel 13 described above with reference to FIG. 1(a). According to example embodiments, the array of pixels may be arranged so as to include m pixels in a horizontal direction by n pixels in a vertical direction. The unit pixel 13 includes a photo-diode and a MOS signal read-out circuit (which are not shown in FIG. 2(a)). As is shown in FIG. 2(a), the center position of the focused image, or optical center, may align with the center position of the first semiconductor chip, because the image sensing area 2 occupies the first surface of the first semiconductor chip with reduced or, alternatively, no dead space. Lines of the reset global wiring 16, line of the select global wiring 17, which connect to a vertical scanning circuit, and lines of the signal global wiring 19, which connect to a signal read-out circuit may be formed on a second surface of the first semiconductor chip. In the plan view illustrated in FIG. 2(b), the global wiring 16 and 17 cross the signal line 19 at, for example, a right angle without shorting each other. In the example illustrated in FIG. 2(b), m vertical direction global lines and 2n horizontal direction global lines are formed excluding ground and power lines. As will be explained in greater detail below, according to example embodiments, lines of the reset, select, and signal global wiring 16, 17 and 19 may have an electrical contacting element, examples of which include a micro-pad 20, that contacts a counterpart electrical contacting element on the second surface of the second semiconductor chip.

Figure 2C:
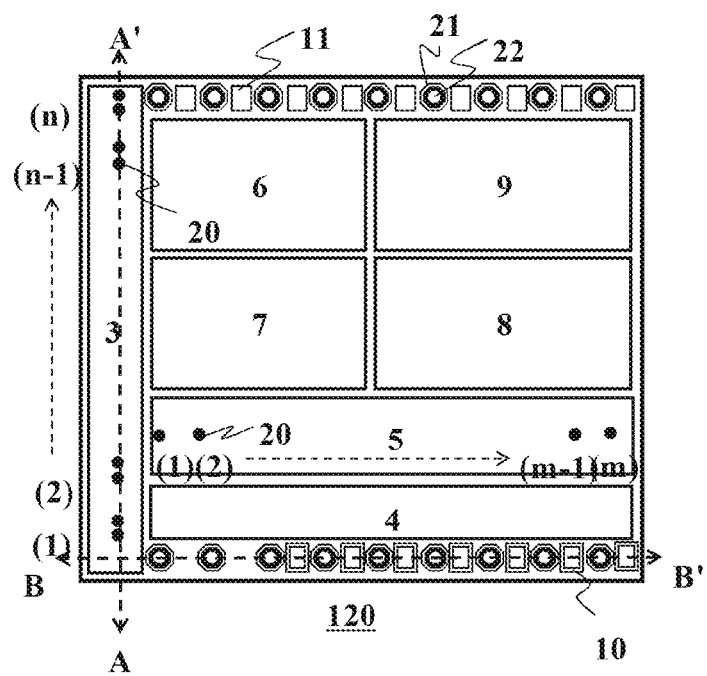

FIG. 2(c) is a plan view of the second surface of the second semiconductor chip 120 according to example embodiments. According to the example illustrated in FIG. 2(c), a vertical scanning circuit 3, a horizontal scanning circuit 4, a signal read-out circuit 5 and other peripheral circuits including a timing pulse generation circuit 6, an AD converter circuit 7, a digital image processing circuit 8, an interface circuit 9, input and/or output buffer circuits 10, input protection circuits 11, and contact pads 21 are formed on the second surface of the second semiconductor chip 120, and are excluded from the first chip 110. Contact pads 21 connect to external input and output terminals through silicon via (TSV) 22. Micro-pads 20 are formed on the vertical scanning circuit 3 and on the signal read-out circuit 5 in order to connect to micro-pads formed on each line of the global wiring on the second surface of the first semiconductor chip as is discussed above in the description of FIG. 2(*b*). According to example embodiments, the micro-pads 20 may also be excluded from the image sensing area 2, and formed on the second surface of the first chip. As is illustrated in FIG. 2(*c*), the vertical scanning circuit 3, the horizontal scanning circuit 4, and the signal read-out circuit 5 each have two longer sides and two shorter sides. As is illustrated in FIG. 2(*c*), a long side of the vertical scanning circuit 3 meets a long side of the horizontal scanning circuit 4 and/or a long side of the signal read-out circuit 5 at, for example, a right angle. Further, according to example embodiments, lengths of the horizontal scanning circuit 4 and the signal read-out circuit 5 in the longitudinal direction, for example in a direction of line B-B', are shortened in comparison to a conventional structure because all peripheral circuits and external input and output terminals on the second semiconductor chip may be placed under the image sensing area 2 on the first semiconductor chip. In this embodiment, the arrangement pitch of micro-pads on the signal read-out circuit 5 may be narrower than the arrangement pitch of the pixels on the first semiconductor chip 110.

The micro-pads 20 on the second surface of the first semiconductor chip 110 may be connected to the micro-pads 20 on the second surface of the second semiconductor chip 120 by electrical contacting element, examples of which include micro-bumps. In the example illustrated in FIG. 2(*c*), neither buffer circuits nor input protection circuits are formed on the first semiconductor chip.

Figure 3A:
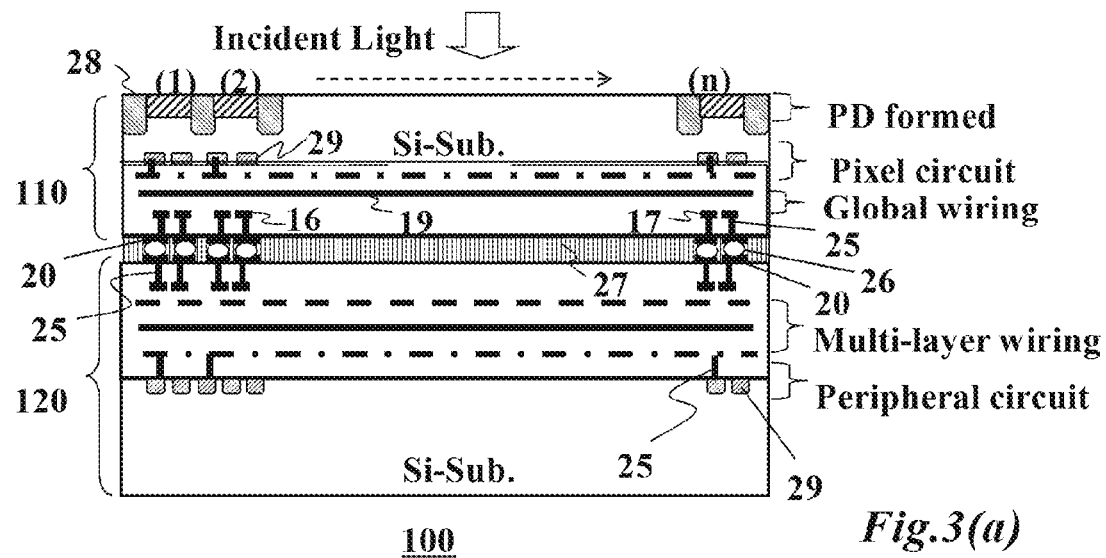
FIG. 3 (a) is a cross sectional views of FIGS. 2 (b) and (c) taken along line A-A.'
Figure 3B:
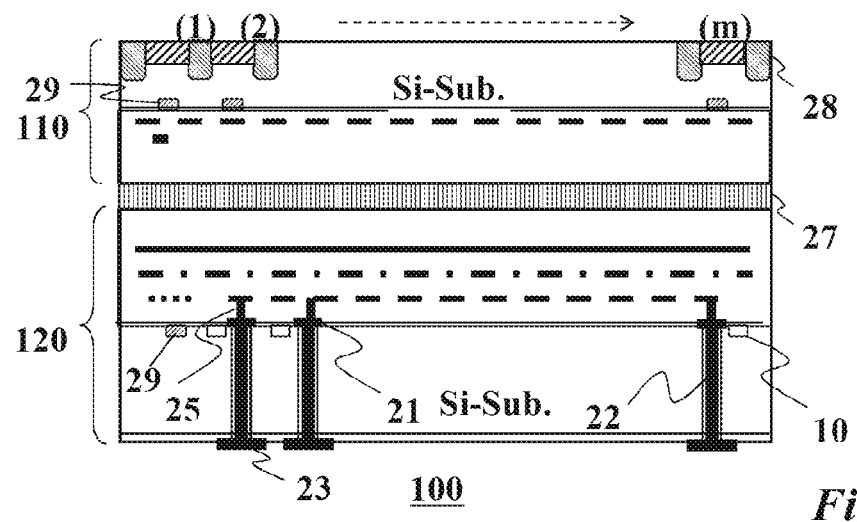
Figure 3C:
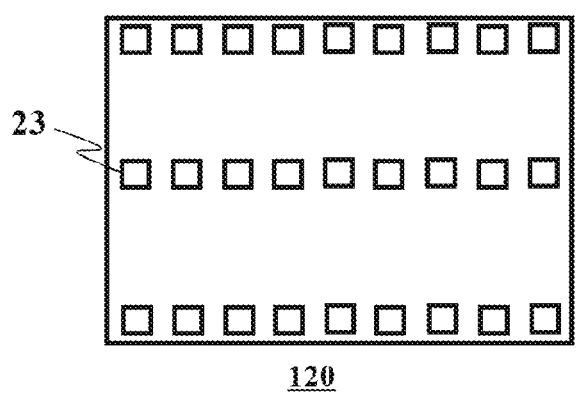

FIG. 3(*a*) is a cross sectional view of a MOS sensor 100 taken along the line A-A' in FIGS. 2(*b*) and 2(*c*) according to example embodiments. In the example illustrated in FIG. 3(*a*), the first semiconductor chip 110 is stacked on the second semiconductor chip 120 with the use of an insulating adhesive layer 27. Photo-diodes (PD) formed on the first surface of the first semiconductor chip 110 may be exposed to incident light and generate photo-induced electric charges. In the example illustrated in FIG. 3(*a*), photo-diodes PDs, or pixels, are separated from one another by an isolation area 28, examples of which include a shallow trench isolation (STI), a highly doped impurity region and a local oxidation of silicon (LOCOS) structures. MOS transistor circuits are formed on the silicon substrate opposite to the first surface of the first semiconductor chip 110. MOS transistor circuits include impurity doped diffusion area 29 for source and drain region.

In the example illustrated in FIG. 3(*a*), lines of global wiring 16, 17 and 19 are formed between the silicon substrate and the insulating adhesive layer 27, and connected to the micro-pads 20 through contact vias 25. According to example embodiments, lines of the reset and select global wiring of 16 and 17 may be formed by patterning the same metal layer because lines of the reset and select global wiring 16 and 17 run in the same direction on the first semiconductor chip 110. In the example illustrated in FIG. 3(*a*), lines of the global wiring of 19 are arranged at, for example, a right angle with respect to lines of the global wiring 16 and 17. Further, lines of the signal global wiring of 19 may be formed by patterning another metal layer avoiding short circuit with lines of the reset and select global wiring of 16 and 17.

According to example embodiments, lines of the signal global wiring 19 may not exist in the cross sectional view taken along line A-A' illustrated in FIG. 2 (*b*). However, lines of the signal global wiring 19 are intentionally drawn in FIG. 3(*a*) for convenience of explanation. Micro-bumps 26 between micro-pads 20 on the second surfaces of the first and second semiconductor chips 110 and 120 may serve as electrical contacts between the first and second semiconductor chips 110 and 120. According to example embodiments, micro-bumps 26 may include, for example, indium (In) and gold (Au).

FIG. 3(*b*) is a cross sectional view of a MOS sensor 100 taken along line B-B' in FIGS. 2(*b*) and 2(*c*) according to example embodiments. In a manner similar to that discussed above with respect to FIG. 3(*a*), MOS transistor circuits for peripheral circuits, wiring layers and micro-pads with contact vias are formed on the second surface of the second semiconductor chip 120. In the example illustrated in FIG. 3(*b*), external input and output terminals 23 are formed on the first surface of the second semiconductor chip 120. The external input and output terminals 23 may be electrically connected to the electrical pads 21 by TSV 22. Input terminals may each have an input protection circuit 10 on the second semiconductor surface.

FIG. 3(*c*) is a plan view of the second surface of the second semiconductor chip 120. According to the example illustrated in FIG. 3(*c*), an array of the external input and output terminals 23 is formed on the bottom of the MOS sensor 100.

Figure 4A:
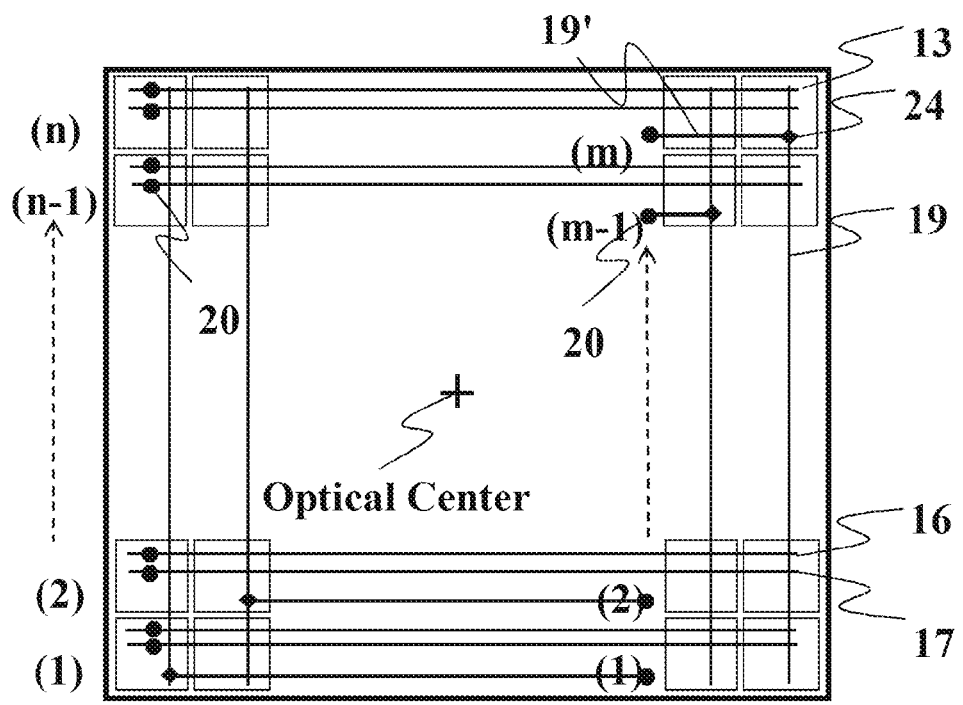
FIG. 4 (a) is a plan view that schematically illustrates an example of global wiring layout and array of pixels on a first semiconductor chip according to at least one example embodiment.
Figure 4B:
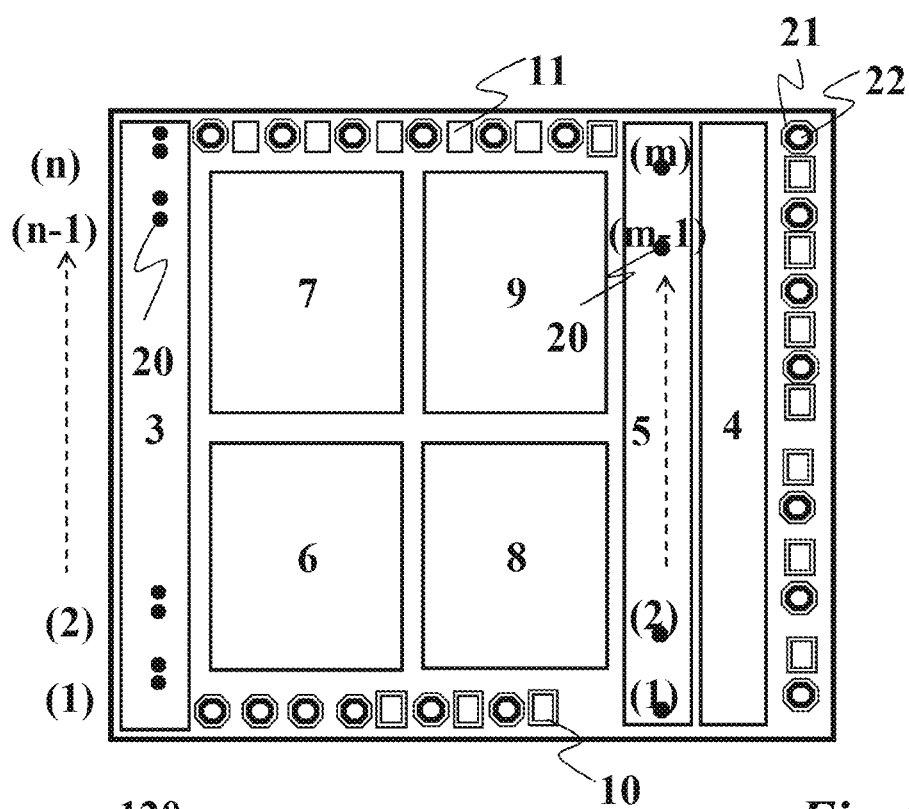

FIG. 4(*a*) and FIG. 4(*b*) are a plan view of the second surface of the first semiconductor chip 110 and a plan view of the second surface of the second semiconductor chip 120, respectively, according to example embodiments. Like the example shown in FIG. 2(*a*), in FIG. 4(*a*), the center position of the focused image, or optical center, is aligned with a center of the first semiconductor chip because the image sensing area 2 occupies the first surface of the first semiconductor chip 110 with little or no dead space. In the example illustrated in FIG. 4(*b*), a longer side of the vertical scanning circuit 3 is arranged so as to be parallel with respect to longer sides of the horizontal scanning circuit 4 and signal read-out circuit 5. Lines of the signal global wiring 19 are electrically connected to the signal global wiring 19' at the contact point 24 through a contact via. The signal global wiring 19 is arranged at, for example, a right angle with the global wiring 19'. The signal global wiring 19' can be formed patterning the same metal layer of the reset and select global wiring 16 and 17 because reset, select, signal global wiring 16, 17 and 19' run in parallel direction without short circuit. Micro-pads 20 are formed on both the first and second semiconductor chips 110 and 120 in order to connect the reset, select, and signal global wiring 16, 17, and 19' to the vertical scanning circuit 3 and the read-out circuit 5.

In the example illustrated in FIGS. 4(*a*) and 4(*b*), the lengths of the horizontal scanning circuit 4 and the signal read-out circuit 5 in the longitudinal direction can be defined by changing the position of the contact point 24 and micro-pads 20. Introducing the parallel structure of the scanning circuit blocks 3 and 4 and the signal read-out circuit block 5 with the new global wiring 19', size and structural restrictions of the scanning circuits and the signal read-out circuits on the second semiconductor chip may be overcome.

Figure 5A:
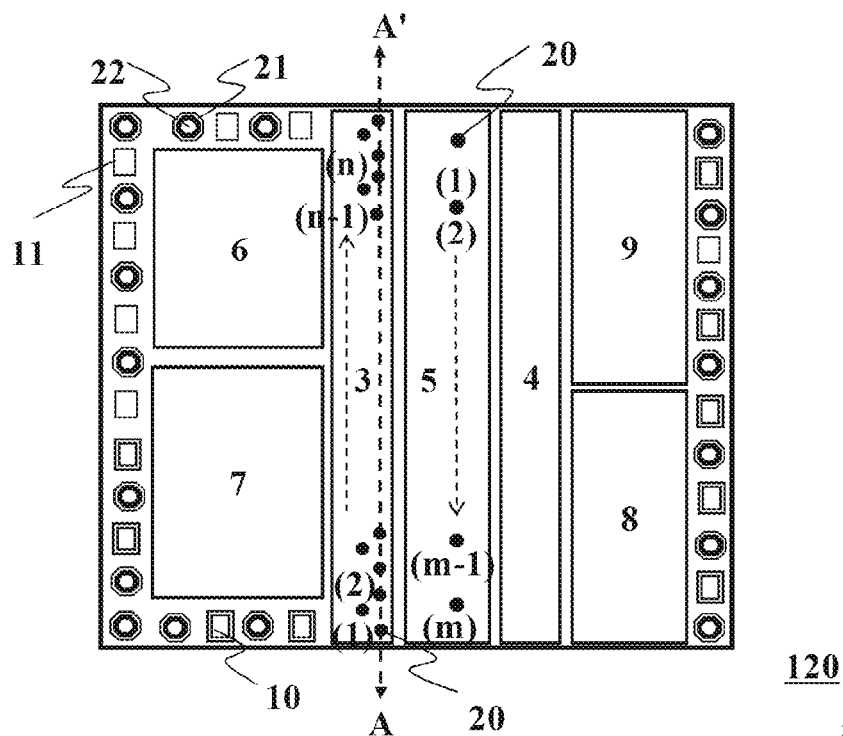
FIG. 5 (a) is a plan view that schematically illustrates an example of a circuit block layout on a second semiconductor chip according to at least one example embodiment.
Figure 5B:
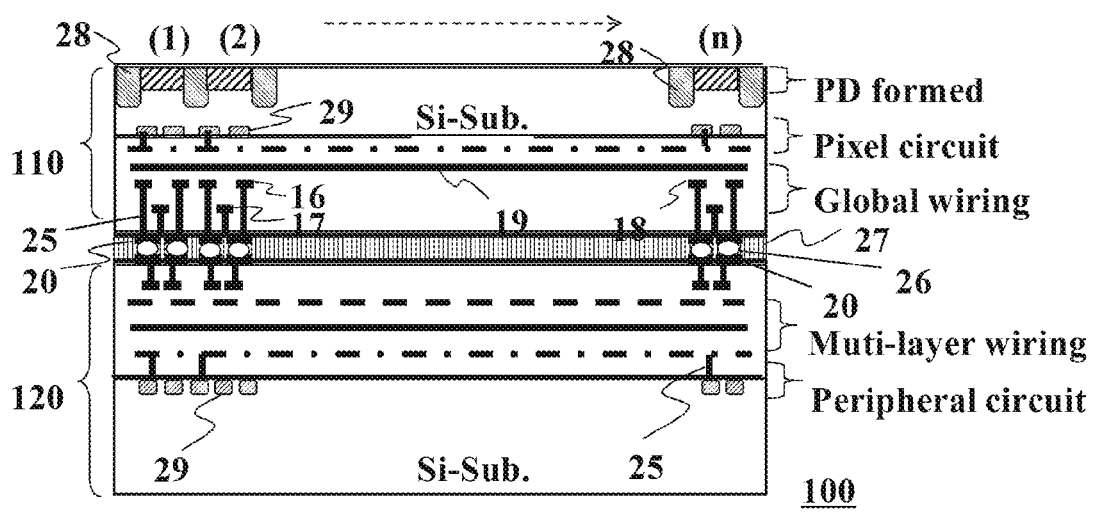

FIG. 5(a) is a plan view of the second surface of the second semiconductor chip 120 and FIG. 5(b) is a cross sectional view of a MOS sensor 100 taken along lines A-A' in FIG. 5(a), respectively according to example embodiments. In the example illustrated in FIGS. 5(a) and 5(b), the first surface of the first semiconductor 110 (not shown in this figure) is occupied with an array of the unit pixels 13 such that an optical center of the array of the unit pixels 13 is aligned with the center of the first semiconductor 110 with little or no dead space. In the example illustrated in FIGS. 5(a) and 5(b), four transistors for each pixel (as shown in FIG. 1(b)) are used to improve image quality, and thus lines of global wiring 18 are added to control the gate electrode of the charge read transistor Tr4.

In the example illustrated in FIGS. 5(a) and 5(b), the read-out circuit 5 is located at the center of the second surface of the second semiconductor chip. Variations in a total length of lines of the global wiring 19 and 19' may be reduced or, alternatively, minimized, and loads of each signal line may be controlled to reduce image shading or non-uniformity of sensor sensitivity depending on the position (for example, a position near center or positions near peripheral image regions).

In the example shown in FIG. 5(b), reset, select, read control and signal global wiring 16, 17, 18 and 19 are formed between the silicon substrate and the insulating adhesive layer 27, and connected to the micro-pads 20 through contact via 25. Micro-pads 20 may also be formed on the second surface of the second semiconductor chip 120 to connect electrically to the global wiring through contact via on the second surface of the first semiconductor chip 110. As is shown in FIG. 1(b), in the example illustrated in FIGS. 5(a) and 5(b), each unit pixel 13 is controlled by lines of reset, select and read control global wirings 16, 17 and 18 which run parallel to one another. The lines of the reset and read select global wiring of 16 and 18 may be formed by patterning the same metal layer, because these two signal lines run in the same direction on the first chip 110. Lines of the global wiring of 17, on the other hand, may be formed by patterning the second metal layer. As a result, according to example embodiments, there may be more space provided between neighboring lines different global wiring, and/or micro-pads spaced so as to avoid a short circuit. Lines of the global wiring of 19 may by arranged at, for example, a right angle with respect to the line of the reset, select, and read select global wiring 16, 17 and 18. Further, lines of the global wiring of 19 may be formed by patterning a third metal layer.

According to example embodiments, the global wiring 19 may not exist in the cross sectional view taken along lines A-A' in FIG. 5(a). However, in FIG. 5(b), a line of the global wiring 19 is intentionally drawn, for convenience of explanation. Lines of the signal global wiring 19 may be electrically connected to lines of the signal global wiring 19' through a contact via (not shown in FIG. 5(b)) in order to make electrical contacts with the signal read-out circuit 5 in the same manner discussed above with respect to FIGS. 4(a) and 4(b). Electrical contacts between the first and second semiconductor chips 110 and 120 may be formed by micro-bumps 26 between micro-pads 20 on the second surfaces of the first and the second semiconductor chips 110 and 120.

Figure 6A:
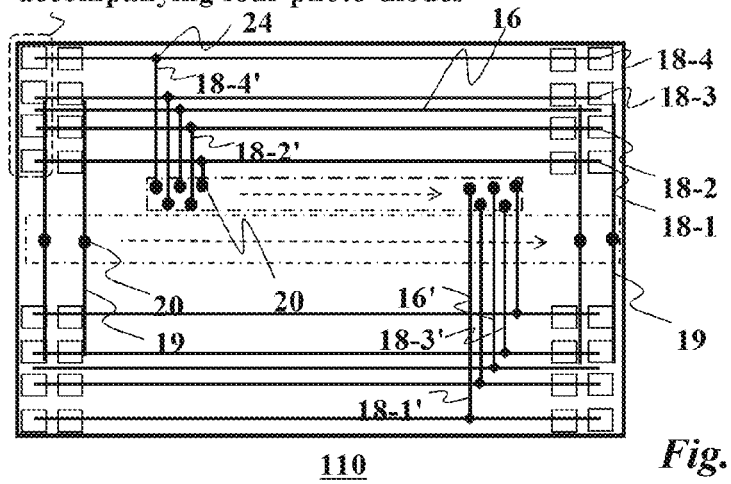
FIG. 6 (a) is a plan view that schematically illustrates an example of global wiring layout and array of pixels on a first semiconductor chip according to at least one example embodiment.
Figure 6B:
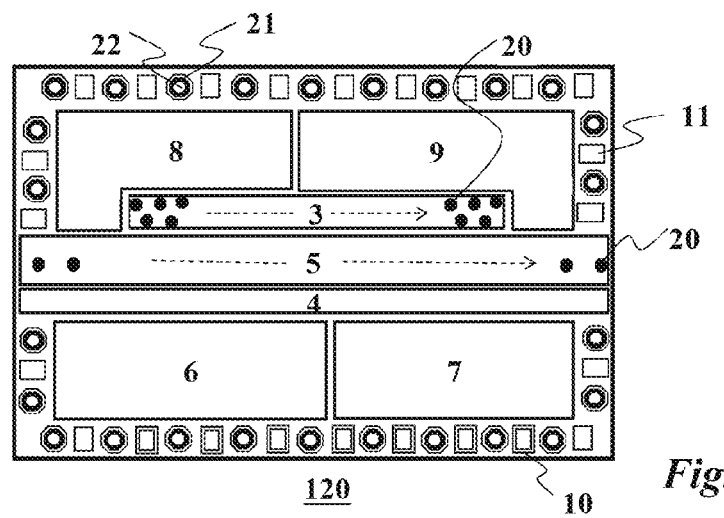

FIG. 6(a) and FIG. 6(b) are a plan view of the second surface of the first semiconductor chip 110 and a plan view of the second surface of the second semiconductor chip 120, respectively according to example embodiments. In the example illustrated in FIG. 6(b), the vertical scanning circuit 3 is rotated 90 degrees to become parallel to the horizontal scanning circuit 4 and the read-out circuit 5, which is located at the center of the second semiconductor chip 120. In the example illustrated in FIGS. 6(a) and 6(b), lines of the signal global wiring 19 are directly connected to the micro-pads 20 on the horizontal read-out circuit 5. Further, according to example embodiments, lines of the global wiring associated with pixel control signals may be arranged parallel to the lines of the global wiring 19, as explained below.

Figure 6C:
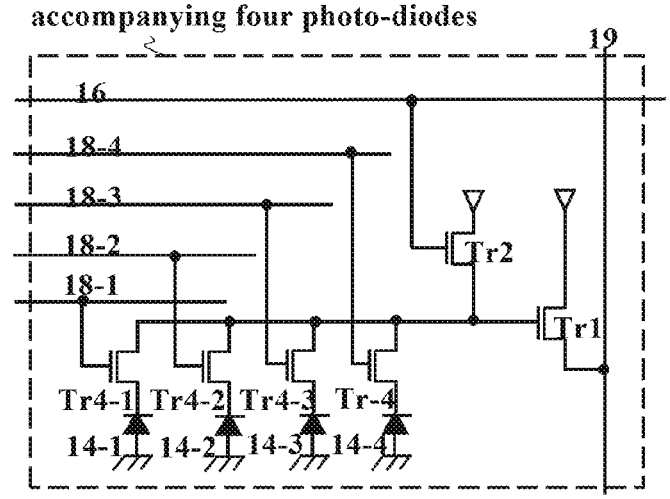

In the example shown in FIGS. 6(a)-6(c), every four pixels forms a group, as is indicated by dotted line in FIG. 6(a). Each group includes a known MOS transistor circuit accompanying four photo-diodes 14-1, 14-2, 14-3 and 14-4 as shown in FIG. 6(c). The MOS transistors Tr4-1, Tr4-2, Tr4-3 and Tr4-4 are switched by the read control signals 18-1, 18-2, 18-3 and 18-4, and transfer photo-generated charges to the gate electrode of the MOS transistor Tr1. In other words, one signal read-out circuit consisting of the MOS transistors Tr1 and Tr2 is shared by four pixels. Consequently, the number of the MOS transistors per pixel may be 1.5 transistors, and the number of the global lines per pixel in the horizontal direction may be 1.25 lines per pixel. According to example embodiments, with such a configuration, the number of lines of global wiring and micro-pads may be reduced and, as a result, miniaturization of pixel and/or chip size may be achieved with more ease without decreasing a production yield from chip design and wafer processing points of view.

In the example illustrated in FIG. 6(a), the read select global wiring 18-1, 18-2, 18-3, 18-4, and reset global wiring 16 are connected to read select global wiring 18-1', 18-2', 18-3', 18-4', and reset global wiring 16', respectively at each contact point 24 in order to connect to the micro-pads 20 on the vertical scanning circuit 3. According to example embodiments, the read select global wiring 18-1, 18-2, 18-3, 18-4 may cross the reset global wiring 16 and read select global wiring 18-1', 18-2', 18-3', 18-4' at, for example, a right angle. Further, the read select global wiring 18-1', 18-2', 18-3', 18-4', and the reset global wiring 16 may be, for example, parallel to the signal global wiring 19. According to example embodiments, because they do not cross each other, the read select global wiring 18-1', 18-2', 18-3', 18-4', and the reset global wiring 16 may be formed by the same metal layer as the signal global wiring 19. Two rectangles surrounded by alternate long and short dashed line in FIG. 6(a) indicate the positions which correspond to locations of the vertical scanning circuit 3 and the horizontal read-out circuit 5 on the second surface of the second semiconductor chip 120 when the first and second semiconductor chips 110 and 120 are stacked on top of one another. In the example illustrated in FIG. 6(b), the vertical scanning circuit 3 is rotated 90 degrees such that a long side of the rectangular vertical scanning circuit 3 becomes, for example, parallel to a long side of the rectangular the horizontal scanning circuit 4. According to example embodiments, with such a configuration, the length in longitudinal direction of the vertical scanning circuit 3 can be maintained without size reduction, and all wiring lengths or load capacitance of the global wiring 19 may be uniform.

Figure 7A:
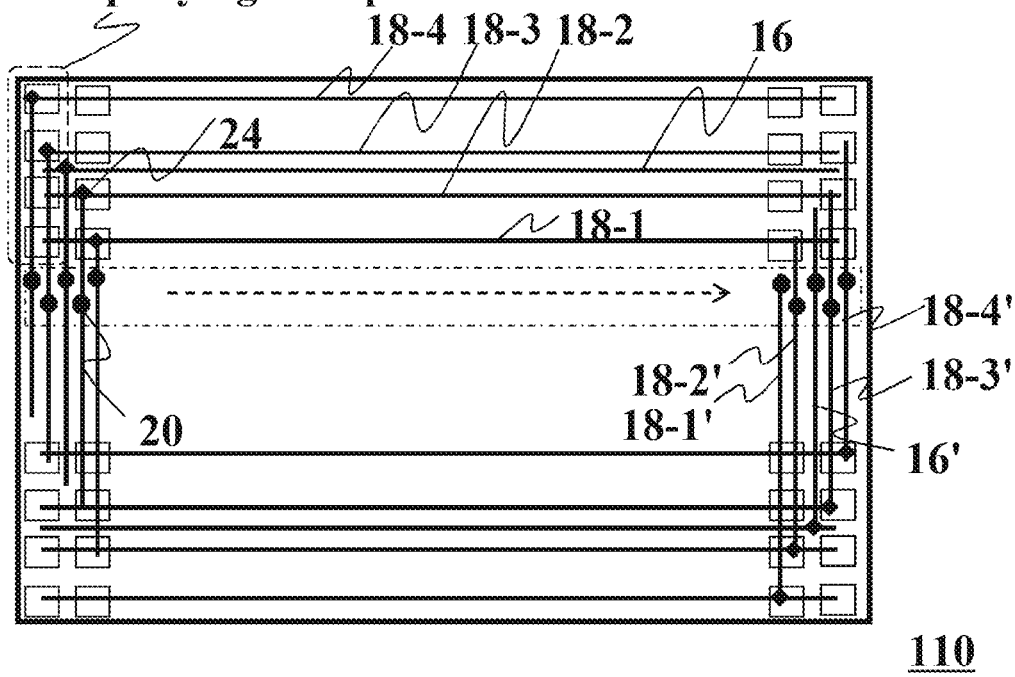
FIG. 7 (a) is a plan view that schematically illustrates an example of global wiring layout and array of pixels on a first semiconductor chip according to at least one example embodiment.
Figure 7B:
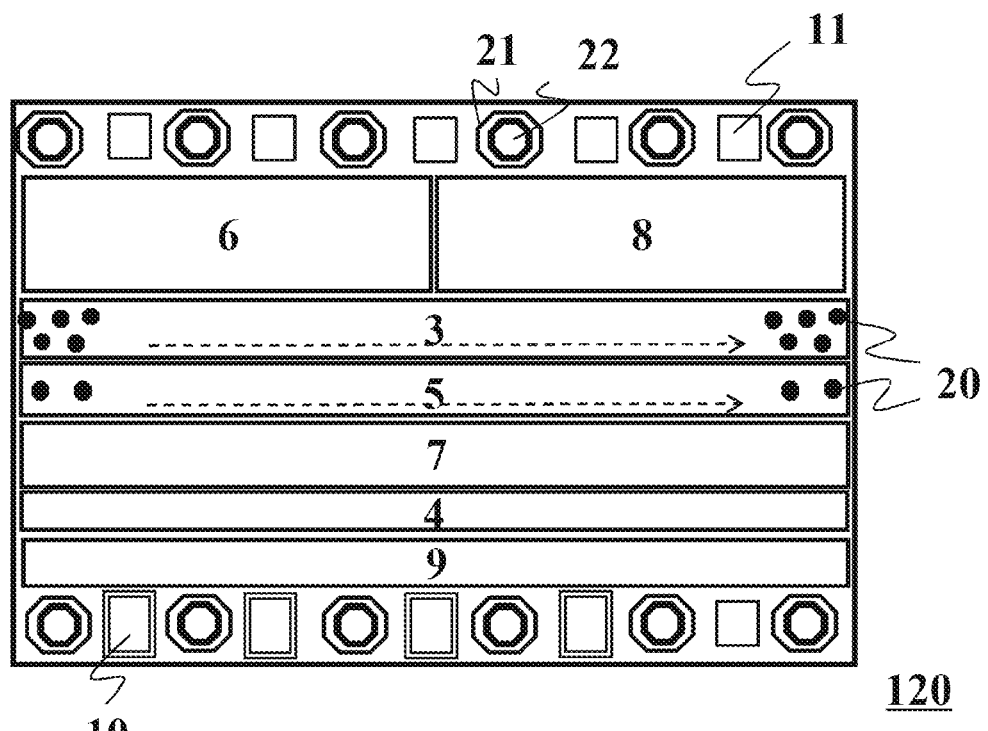

FIG. 7(a) and FIG. 7(b) are a plan view of the second surface of the first semiconductor chip 110 and a plan view of the second surface of the second semiconductor chip 120, respectively according to example embodiments. Similar to FIGS. 6(a)-6(c), in the example in FIGS. 7(a) and 7(b), elements are arranged such that long sides of the vertical scanning circuit 3 are, for example, parallel to long sides of the horizontal scanning circuit 4 and long sides of the read-out circuit 5, which is located at the center of the second semiconductor chip 120. Lines of the global wiring 19 (which is not shown in FIG. 7(a) or 7(b) for the sake of figure simplicity) may be directly connected to the micro-pads 20 on the horizontal read-out circuit 5. In the example shown in FIGS. 7(a) and 7(b), the read select global wiring 18-1, 18-2, 18-3, 18-4, and the reset global wiring 16 are connected to the read select global wiring 18-1', 18-2', 18-3', 18-4', and the reset global wiring 16', respectively at each contact point 24 in order to connect to the micro-pads 20 on the vertical scanning circuit 3. A rectangle surrounded by alternate long and short dash line illustrated in FIG. 7(a) indicates the position on the first chip 110 that corresponds to the vertical scanning circuit 3 on the second surface of the second semiconductor chip 120, when the first chip 110 is stacked on the second chip 120. In the example illustrated in FIGS. 7(a) and 7(b), the length of the vertical scanning circuit 3 in a longitudinal direction may be enlarged to be similar or equal to the length of the horizontal scanning circuit 4 in a longitudinal direction. With this configuration, more spaces among lines of the read select global wiring 18-1', 18-2', 18-3', 18-4', and the reset global wiring 16' may be left, thereby increasing the ease with which higher resolution MOS sensors with smaller form factors are designed and manufactured.

Further, according to example embodiments, each line of the read select global wiring 18-1', 18-2', 18-3', 18-4' may have an extended portion in order to adjust a total length of each line so as to be equal. Thus, image quality degradations like sensitivity non-uniformity or fixed pattern noise due to signal delays may be suppressed as a result of uniformity in the line loads. As shown in FIG. 7(b), each column signal output of the signal read-out circuit 5 is connected to a column of one of the AD converter circuits included the AD converter 7, which may be, for example, a column-based AD converter. According to example embodiments, with this configuration, power dissipation and heat generation may be reduced.

FIG. 8 (a) and FIG. 8 (b) are perspective views of a MOS sensor 100 before corner polishing and after corner polishing, respectively, according to example embodiments. In the example shown in FIGS. 8(a) and 8(b), the first semiconductor chip 110 is stacked on a second semiconductor chip 120 of the same chip size, and the image sensing area 2 is not formed near the four corners on the first surface of the first semiconductor chip 110. As shown in FIG. 8(b), after removing these four corners by chemical or mechanical polishing, the outer shape of the sensor 100 is rounded such that the sensor 100 may be installed into a package or housing of limited space like that of a thin endoscope probe.

Figure 9A:
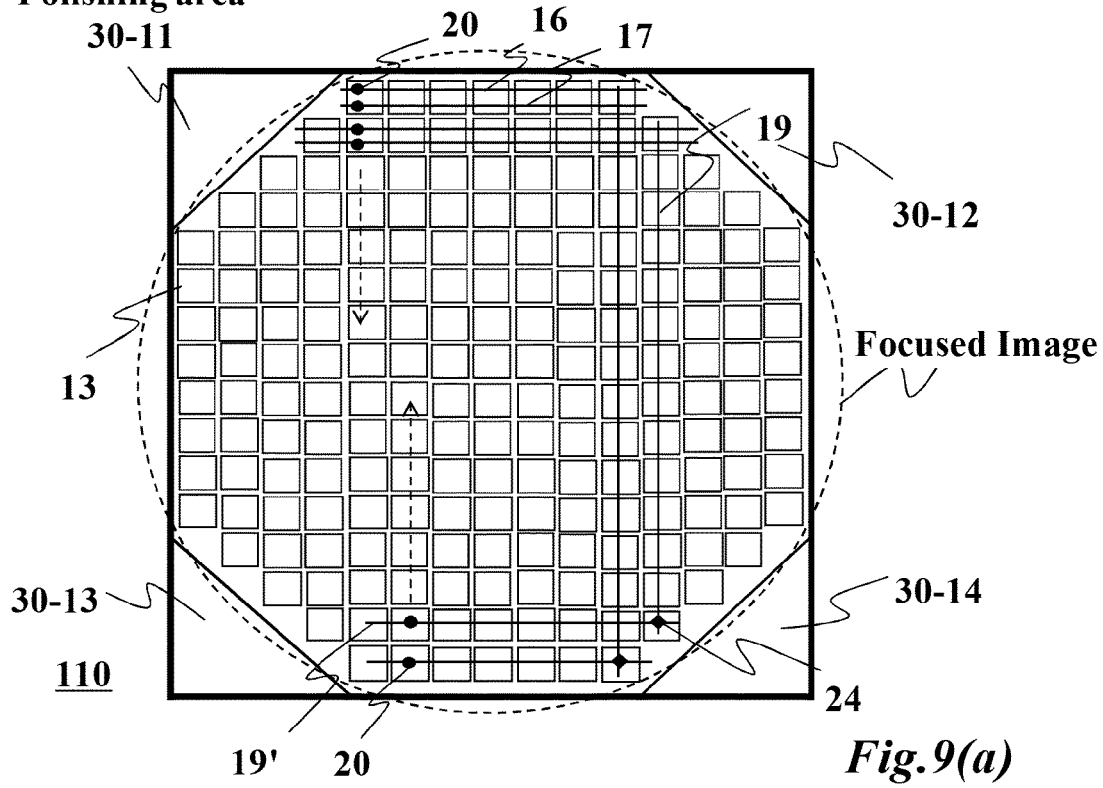
FIG. 9 (a) is a plan view that schematically illustrates an example of global wiring layout and array of pixels on a first semiconductor chip according to at least one example embodiment.
Figure 9B:
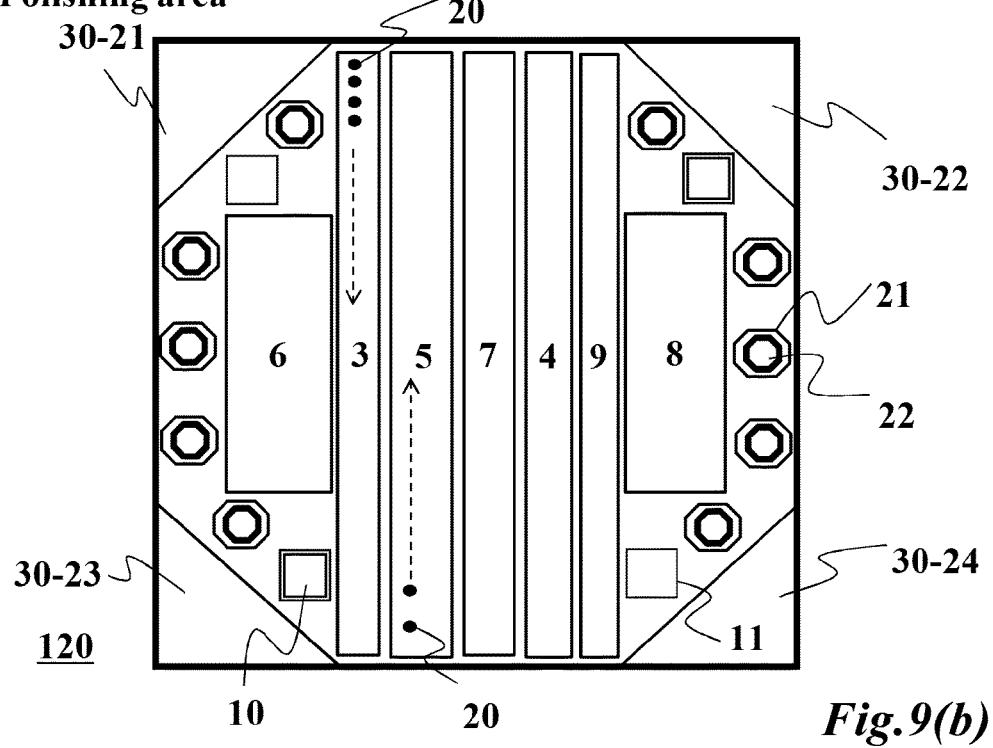

FIG. 9(a) and FIG. 9(b) are a plan view of the second surface of the first semiconductor chip 110 and a plan view of the second surface of the second semiconductor chip 120, respectively according to the example embodiments. As is explained above with reference to FIGS. 8(a) and 8(b), polishing areas of 30-11, 30-12, 30-13, and 30-14 are formed near the corners on the first semiconductor chip 110. Polishing areas of 30-21, 30-22, 30-23, and 30-24 may be formed near the corners on the second semiconductor chip 120. According to example embodiments, pixels, peripheral circuits, TSVs and external pads may be formed so as not to be in these polishing areas. According to example embodiments, some global wiring extended from the image sensing area 2 may remain in the polishing areas 30-21, 30-22, 30-23, and 30-24. According to example embodiments, with this configuration, a part of the polishing area is removed by either polishing or dicing such that the MOS sensor 100 fits into the space of the camera system in which the MOS sensor 100 is used. After dicing or polishing, the contours of the MOS sensor 100 may give the MOS sensor the shape of, for example, an octagon, but the MOS sensor 100 is not limited to this shape. Further, according to example embodiments, one or more of the four corners of the MOS sensor 100 may not be polished. For example, only one or two corners may be polished away to meet the space allowed. Any round, or substantially round, shape can be easily made by controlling the polishing conditions without using dicing saw or laser saw. According to example embodiments, pixels may be distributed stepwise near the corner to capture most of the image through the lens system.

Figure 10A:
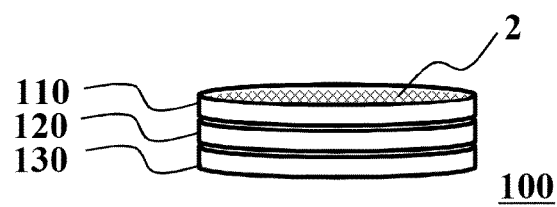
FIG. 10 (a) is a perspective view that schematically illustrates an example of the configuration of a MOS sensor according to at least one example embodiment.
Figure 10B:
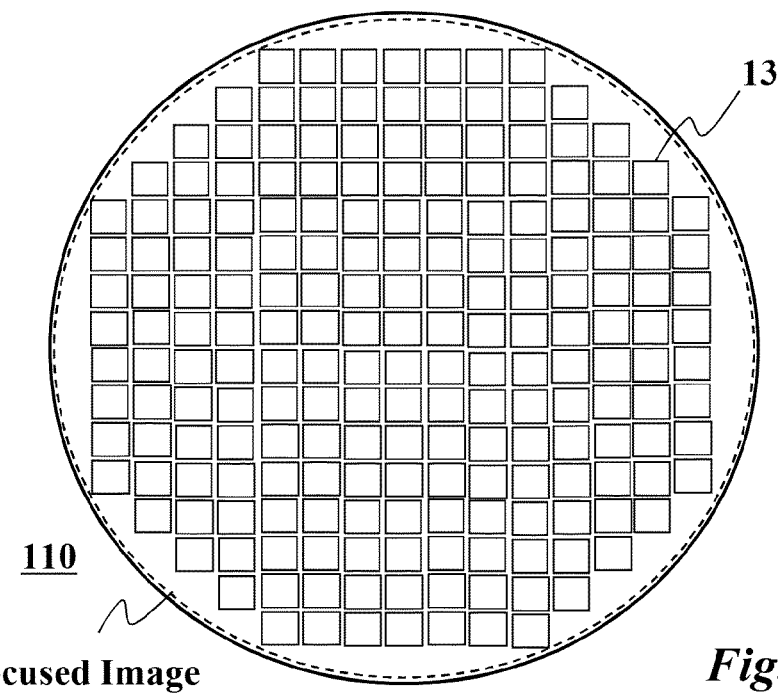
Figure 10C:
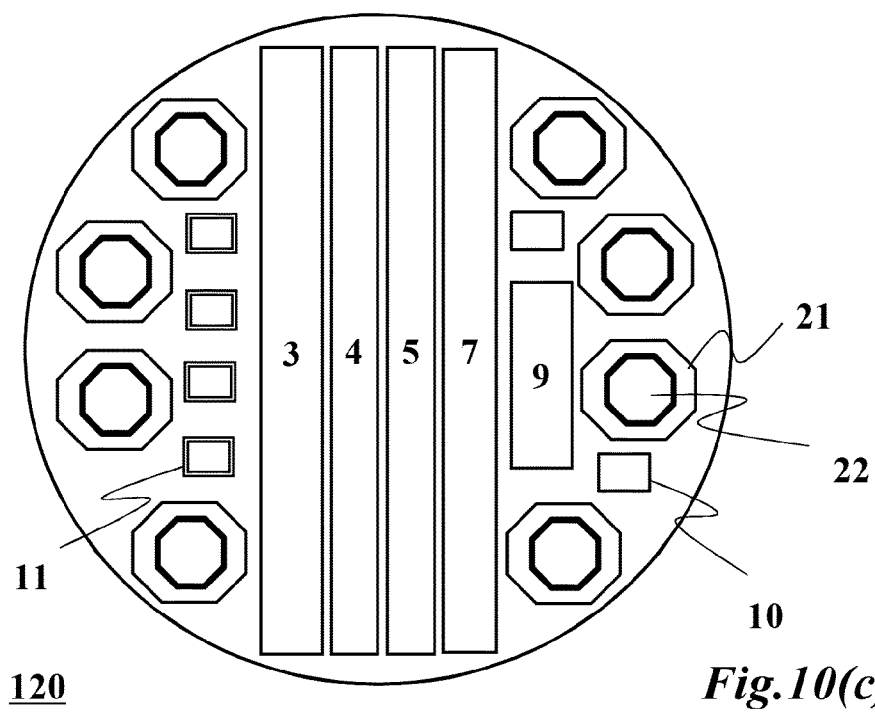

FIG. 10 (a) is a perspective view of a MOS sensor 100, according to example embodiments. In the example shown in FIG. 10(a), the first and the second semiconductor chips 110 and 120 are staked on a third semiconductor chip 130. According to example embodiments, the MOS sensor 100 illustrated in FIGS. 10(a)-(c) may be formed such that an external input or output terminal 23 is formed not on the first surface of the second semiconductor 120, but rather on the bottom of the MOS sensor 100. The example illustrated in FIGS. 10(a)-10(c) shows a columnar shape MOS sensor which may be suitable for use with a smaller or thinner camera scope or probe, examples of which include a medical endoscope. As is mentioned above, a ratio of the peripheral circuit area including input and output components with respect to a total area of a surface of the MOS sensor 100 may increase as the MOS sensor becomes smaller. For example, according to example embodiments, a ratio of the input and output buffer circuit and TSV area to the peripheral circuit area may increase substantially as the second semiconductor chip becomes smaller. By using a reduced or, alternatively, minimum number of input and output terminals, and the three-chip structure illustrated in FIG. 10(a), some peripheral circuits including, for example, a timing pulse generation circuit 6 and a digital image processing circuit 8 can be moved to the third semiconductor chip 130.

FIG. 10(b) and FIG. 10(c) are a plan view of the second surface of the first semiconductor chip 110 and a plan view of the second surface of the second semiconductor chip 120, respectively according to example embodiments. In the example illustrated in FIGS. 10(a)-10(c), the external forms of the first, the second and the third semiconductor chips 110, 120 and 130 (not shown) chips are circular. As is illustrated in FIG. 10(b), a pixel array of the unit pixels 13 occupies the surface of the first semiconductor chip 110 and covers most of the focused image. The vertical scanning circuit 3, the horizontal scanning circuit 4, the signal read-out circuit 5, the column-based AD converter circuit 7 and the interface (I/F) circuit 9 may be formed on the second semiconductor chip 120 as shown in FIG. 10(c). According to example embodiments, other peripheral circuits including, for example, like the timing pulse generation circuit and a digital image processing circuit 8 may be formed on the one surface of the third semiconductor chip 130, and the external input and output terminals 23 may be formed on the other surface of the third semiconductor chip 130.

According to example embodiments, with the structure illustrated in FIGS. 10(a)-10(c), almost all the first surface of the first semiconductor chip 110 is occupied by the image sensing area of the image sensing area 2 while dead space on the first surface of the first semiconductor chip 110 is reduced or, alternatively, minimized. Further, the position of the optical center of the array of pixels on the first semiconductor chip 110 may align with the position of the center of the chip 100. A round or polygon shaped MOS sensor may be suited for use in an endoscope probe which is inserted into a blood vessel.

In the past it was more difficult for the conventional dicing machine to cut a semiconductor wafer into chips having a shape of a circle, an elliptical or a polygon with more than five sides in shape. A pulsed laser beam machining based on multiple photon absorption phenomena has been developed (U.S. Pat. No. 6,992,026). Using the pulsed laser beam dicing machine instead of a rotating dicing blade, the MOS sensor having a shape of a circle, an elliptical or a polygon with more than five sides may be easily obtained without producing fusing or cracking in relation to a predetermined dicing line on the wafer.

FIG. 11 (a) is a plan view of the second surface of the second semiconductor chip 120 according to example embodiments. The read select global wiring 18-1, 18-2, 18-3, 18-4, and the reset global wiring 16 are connected to the read select global wiring 18-1', 18-2', 18-3', 18-4', and the reset global wiring 16', respectively, at each contact point 24 in order to connect to the micro-pads 20 on the vertical scanning circuit 3. Lines of global wiring transmitting the control signals including, for example, lines of the read select global wiring 18-1, 18-2, 18-3 and 18-4 and the reset global wiring 16', may run, for example, parallel with respect to one another and extend to an edge of the first semiconductor chip 110. For example, lines of the read select global wiring 18-1, 18-2, 18-3 and 18-4 and the reset global wiring 16' are formed so as to extend from the one end of the first semiconductor chip 110 to the other end of the first semiconductor chip 110.

Though some positional relationships between lines of global wiring and positional relationships between peripheral circuits are described above using the terms 'right-angle' and 'parallel', example embodiments are not limited to these parallel or right-angle arrangements, and other angles may exist between lines of global wiring and between peripheral circuits.

Figure 11A:
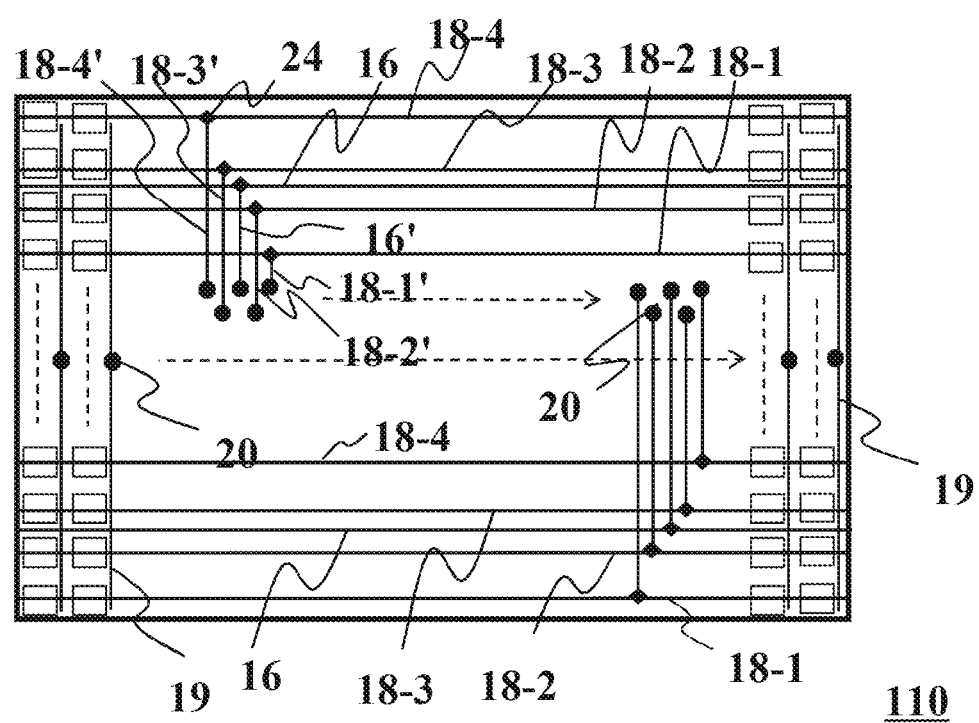
FIG. 11 (a) is a plan view that schematically illustrates an example of global wiring layout and array of pixels on a first semiconductor chip according to at least one example embodiment.
Figure 11B:
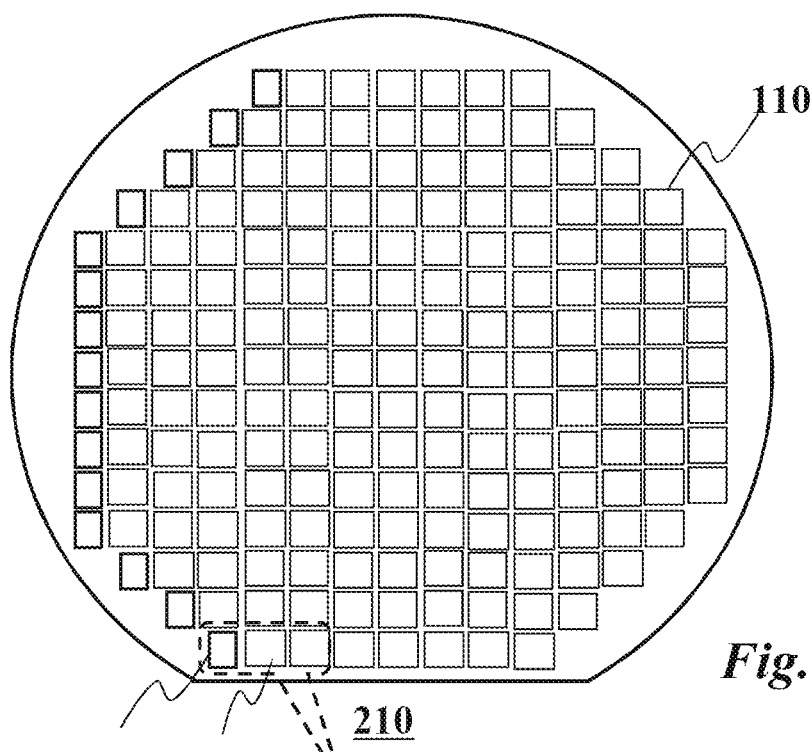
Figure 11C:
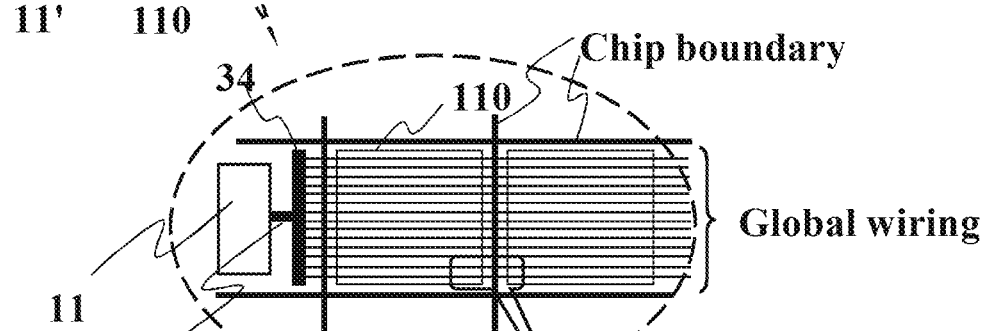

FIG. 11(b) illustrates a silicon wafer 210. FIG. 11(c) illustrates an enlarged portion of the silicon wafer 210. In the example illustrated in FIGS. 11(a)-11(c), the MOS sensor 100 may be fabricated using the first semiconductor wafer 210 as illustrated in FIG. 11(b). The first semiconductor wafer 210 may include an array of the first semiconductor chips 110. The global wiring used for transmitting control signals for the first semiconductor chips 110 may be formed crossing the vertical dicing lines as shown in FIG. 11(c). Ends of the lines of the global wiring of the first chips 100 may be connected with shunt wiring 34. Input protection circuit blocks 11' may be formed beside the semiconductor chips 110 on the periphery of the semiconductor wafer 210. Each input protection block 11' may include either a shunt wiring 34 or input protection circuit 11, or a combination of the shunt wiring 34 and input protection circuit 11 connected with conductive portion 33, as is shown in FIG. 11 (c). As is discussed in greater detail below, the input protection block 11' may be formed during an MOS front-end wafer processing operation. According to example embodiments, by arranging the shunt wiring 34 near the wafer periphery, global wiring lines may be easily connected with a ground terminal and a power lines. According to example embodiments, the wafer peripheral area, which may otherwise be occupied by a blank area or defective chips, may be utilized as a location for input protection blocks 11'. Further, the input protection blocks 11' may be formed by simple patterning.

Before laminating or stacking the first semiconductor wafer 210 and the second semiconductor wafer 220, which will be discussed in greater detail below with reference to FIG. 11(b), MOS transistor input gates connected with lines of read select global wiring like 18-1, 18-2, 18-3, and 18-4 are protected against the ESD failure because said global wiring (composed of, for example, aluminum) on each chip is electrically connected so as to cross the chip boarder or dicing line on the first semiconductor wafer 210. According to example embodiments, the global wiring on the first wafer 210 may be connected to a ground line or input protection block 11' on the periphery of the first semiconductor wafer 210 as is discussed above with reference to FIGS. 11(b) and 11(c).

After laminating or stacking the first and the second semiconductor wafers 210 and 220, micro-pads connected to MOS transistor input gates on the first semiconductor chips 110 are not exposed to an exterior of the structure formed by the first and second semiconductor wafers, but connected to micro-pads that are directly connected to MOS transistor output terminals on the second semiconductor chips 120. Consequently, the above mentioned ESD risk may be reduced even in early stages the wafer processing operation.

Figure 11D:
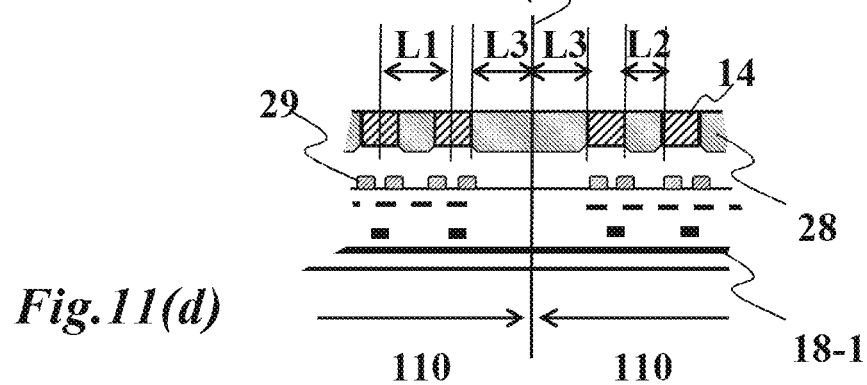

Global wiring including, for example, the read select global wiring 18-1, is formed across the chip boundary area and dicing position 31 as shown in FIG. 11(d). According to example embodiments, the first semiconductor wafer 210 is stacked on the second semiconductor wafer 220 in such a manner that second semiconductor surfaces of both wafers 110 and 120 face each other, thereby forming a stacked wafer structure 300. Then the stacked wafer structure 300 is divided into separate MOS sensors 100 and other peripheral chips or parts like an input protection block 11'. The global wiring running over the chip boundaries is also cut such that lines of the global wiring on each MOS sensor 100 and other lines including, for example, a ground terminal and a power lines, become electrically independent. The width L1 is defined as the distance between the center positions of pixels. The width L2 is defined as the width of the isolation area 28 between two pixels inside the image sensing area 2. As shown in FIG. 11(d), the width L3 is defined as the width of the isolation area 28 around the chip periphery. The width of the dicing area is then L3+L3 between the two first semiconductor chips 110 because the dicing position 31 is the center of the isolation area 28 between two adjacent first semiconductor chips 110.

FIG. 12(a) shows a plan view of the first semiconductor wafer 210 on which an array of the first semiconductor chips 110 is formed, and FIG. 12(b) shows a cross sectional view of the stacked wafer structure 300 which includes the first and the second semiconductor wafers 210 and 220, according to example embodiments. According to example embodiments, the first semiconductor chips 110 may be continuously patterned on the first semiconductor wafer 210. Further, global wiring transmitting control signals (not shown) may be formed and extended to a periphery of the first semiconductor wafer 210 in the same manner discussed above with reference to FIGS. 11(a)-11(d). A second surface of the first semiconductor wafer 210 may be stacked on, and connected to, a second surface of the second semiconductor wafer 220 via micro-bumps 26. Micro lenses 32 may be formed on the first surface of the first semiconductor wafer 210, and external contact terminals 23 may be formed on the first surface of the second semiconductor wafer 220. Plural MOS sensors 100 may be obtained by dicing the stacked wafer 300 at the dicing position 31.

FIG. 12(c) shows a cross sectional view of a part of the first semiconductor wafer 210 shown in FIG. 12(b). The width L1 is defined as the distance between the center positions of pixels. The width L2 is defined as the width of the isolation area 28 between two pixels inside the image sensing area 2. As shown in FIG. 12(c), the width of the isolation area 28 between the two first semiconductor chips 110 is also L2. Consequently, after dicing, a width of the isolation area at the edge of the first semiconductor chip 110 is one half of L2 because the dicing position 31 is the center of the isolation area 28 between two adjacent first semiconductor chips 110.

According to example embodiments, with the configuration illustrated in FIGS. 12(a)-12(c), more than two MOS sensors 100 can be tiled without losing pixel information between the diced semiconductor chips, and the width L1 may be maintained across multiple MOS sensors 100. Consequently, image sampling points may be distributed uniformly over the MOS sensors 100. Further, according to example embodiments, global wiring including, for example, reset global wiring 16, and read select global wiring 18-1, 18-2, 18-3, and 18-4 may be extended to and edge of the image sensing area 2, so as to enable a mask pattern of the first semiconductor chip 110 to be continuously exposed on the first semiconductor wafer 210 without forming extra dicing or a scribe area between the first semiconductor chips 110. According to example embodiments, the above mentioned pulsed laser beam dicing machine may be used to cut the wafer with precision.

As is illustrated by the example discussed above with reference to FIGS. 12(a)-12(c), processing of the first semiconductor wafer 210 may be initiated before defining final attributes of the first semiconductor wafer 210 including, for example, chip size or total pixel number. Thus, an MOS sensor fabrication process according to example embodiments can be used to manage either a high volume lot or a small quantity lot while producing quick turnaround time (QTAT) and cost reduction as a whole. Further, according to example embodiments, as a chip size becomes smaller, an amount of wafer surface area lost due to a dicing margin is reduced. Further, according to example embodiments, a total amount of the MOS sensor obtained from a wafer may be increased and, the ESD failure may be substantially prevented, thereby resulting in a higher yield and a further decrease in chip cost. Further, the chip cost reductions may contribute to a reduction in medical expenses because, for example, an MOS sensor according to example embodiments may be suitable for a disposable capsule endoscope.

Using the wafer processing methods described above with reference to FIG. 12, a first chip 110 produced from the wafer 210 the portion of the first surface of the first chip 110 that is occupied by the image sensing area 2 may be, for example, above 90%, above 95%, between 96% and 99% or, alternatively, between 96% and nearly 100%. For example, according to at least one example, embodiment, for a rectangular or a square chip, a dicing or scribe margin may be maintained around the periphery of the chip to avoid damage like cracking and chipping during blade dicing. According to at least one example embodiment, the dicing margin may be 50 µm on each side of the chip. Accordingly, using, as an example, a square first chip 110 having an image sensing area 2 of 22 sq. mm., each side of the image sensing area 2 would be around 4.7 mm in length. Adding the 50 µm dicing or scribe margin discussed above to each side of the image sensing area 2, a total length of each side of the first chip 110 would be 4.8 mm. Consequently, an area of the first chip 110 would be about 23 square mm. Consequently, in the example described above, the portion of the total area of the first surface of the first chip 110 that is dedicated to the image sensing area 2 would be 22/23, or about 96%. Further, according to example embodiments, the same percentages discussed above may be experienced when the first chip 110 is not shaped as a square but shaped as is shown in FIGS. 8(a)-10 (e.g., a circle, oval, polygon having more than 4 sides, or polygon having rounded edges).

Further, according to at least one example embodiment, when dicing is carried out using a pulsed laser, as is discussed above with reference to FIGS. 12(a)-(c), the dicing margin of 50 µm discussed in the example above may be reduced or, alternatively, eliminated. Consequently, when the pulsed laser is used for dicing, the portion of the total area of the first surface of the first chip 110 that is dedicated to the image sensing area 2 can be higher than 96% and can approach 100%.

Figure 13:
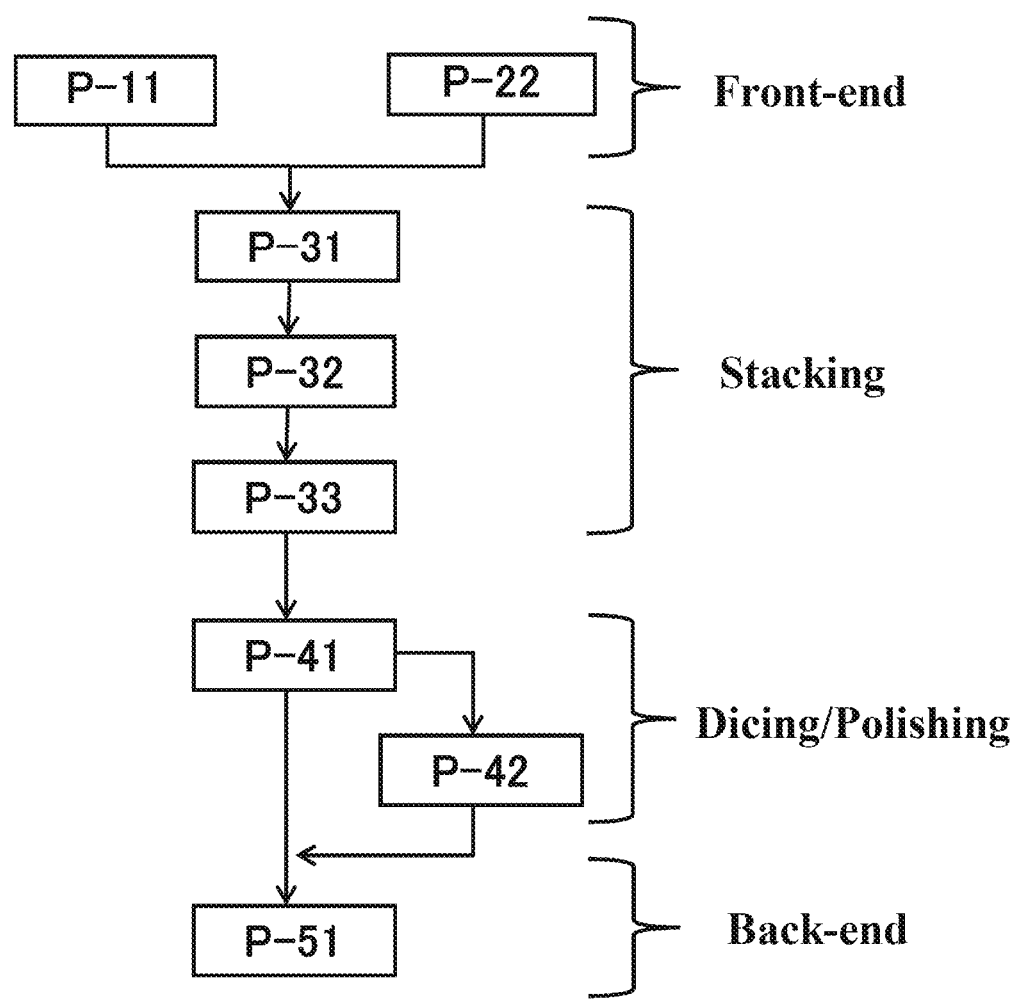
FIG. 13 is a flowchart outlining a method for manufacturing process according to at least one example embodiment.

FIG. 13 shows a MOS sensor manufacturing process flow chart according to example embodiments. The flow chart illustrated in FIG. 13 is composed of four major parts: a front-end process, a stacking process, a dicing process and a back-end process. During the front-end process, the first semiconductor chip 110 on the first semiconductor wafer 210 and the second semiconductor chip 120 on the second semiconductor wafer 220 are prepared at the process steps of P-11 and P-22, respectively. The front-end process is based on an MOS device fabrication process. The process step P-11 may include, for example, a wafer thinning process and a formation of the global wiring associated with pixel control signals which extend to the periphery of the first semiconductor wafer 210 thereby crossing the dicing lines between individual first semiconductor chips 110 in the first semiconductor wafer 210. The process step P-22 may include, for example, a formation of TSVs and output terminals 23.

Process step P-31 includes a formation of micro-pads on the first surfaces of both the first and semiconductor wafers 210 and 220, and process step P-32 includes a formation of micro-bumps on at least one of the first and second 210 and 220 wafers to ensure electrical contact between the first and the second semiconductor wafers 210 and 220. According to example embodiments, next, process P-33 includes stacking or laminating the first semiconductor wafer 210 on the second semiconductor wafer 220 to form the stacked wafer structure 300. With respect to three-chip MOS sensors according to example embodiments, forming the three-chip MOS sensors may include, further stacking the second semiconductor wafer 220 on a third semiconductor wafer 230 in step P-33.

Next, in step P-41, the stacked wafer structure 300 is divided into a plurality of MOS sensors 100 by, for example, a dicing saw or the pulsed laser beam dicing machine. Global wiring extending outside a chip area on one or more of the first, second and third semiconductor wafers 201, 202 or 203 may also be cut during this dicing process in step P-41. After dicing, in step P-42 corner areas of the MOS sensor are polished to form a round outer shape when desired by an operator of the MOS sensor fabrication process. In step P-51, the diced, or diced and polished, chips undergo desired testing and packaging.

With a fabrication method according to example embodiments, even though the first chips 110, themselves, do not include protection circuits 11, the MOS transistor input gates on the first chips 110 of the first wafer 210 may be protected against ESD by the feature of extended global wiring reaching the shunt wiring or input protection circuits 11 on the periphery of the first semiconductor wafer 210. According to example embodiments, the first wafer 210 may be formed such that the protection circuits 11 are only located on the periphery of the first wafer 210, and not inside or on the first chips 110 included in the first wafer 210. According to example embodiments, after stacking the wafers and before wafer dicing, MOS transistor input gates may be connected with output terminals on the second semiconductor wafer 220. Consequently, the MOS transistor input gate voltages may be kept stable from the front-end process to the back-end process.

Figure 14:
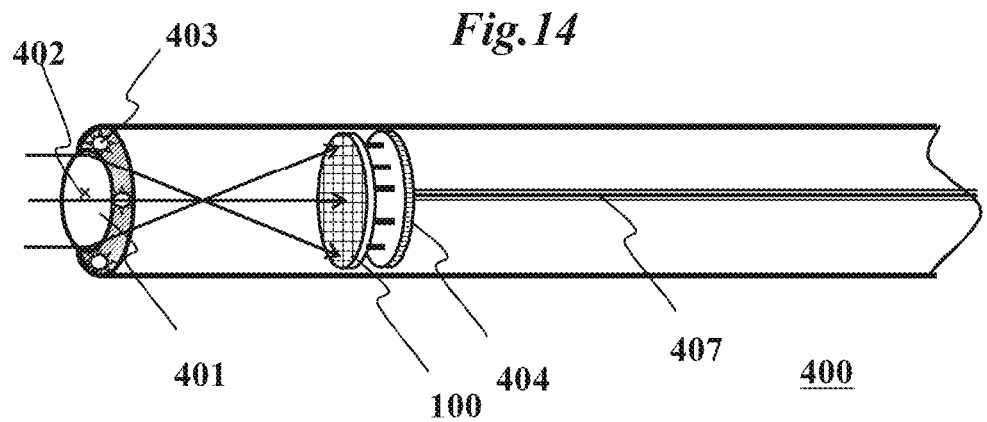
FIG. 14 is a perspective view that schematically illustrates an example of the configuration of a medical endoscope using a MOS sensor according to at least one example embodiment.

FIG. 14 illustrates an example of a medical endoscope probe 400 employing a MOS sensor 100 according to example embodiments. In the example illustrated in FIG. 14, the endoscope probe 400 includes a collecting lens 401, LED lighting 403, a supporting board 404, and a communication cable 407. The outer shape of the MOS sensor 100 used may be, for example, a circle or polygon similar to that of the probe inside. Consequently, the center position of the optics 402 may be aligned with a center position of the MOS sensor 100. Thus, incident light that passes through the center of the collecting lens 401 with an incident angle of 0° may reach the center of the MOS sensor 100.

Figure 15:
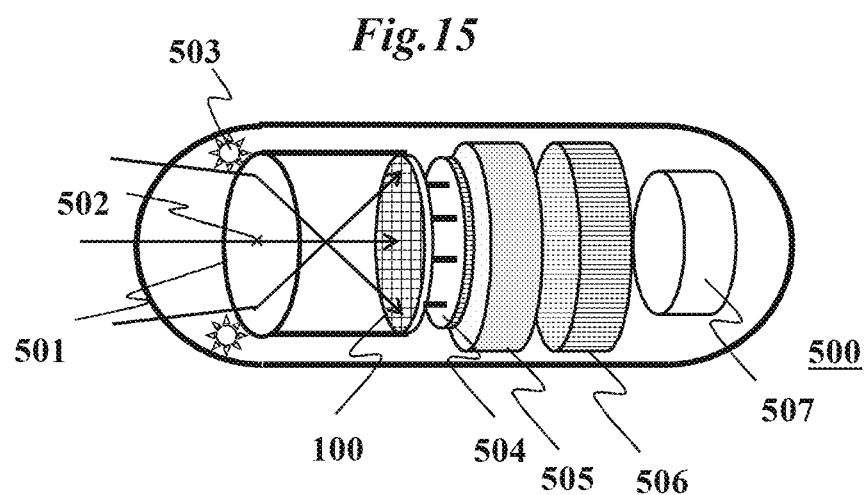
FIG. 15 is a perspective view that schematically illustrates an example of the configuration of a capsule endoscope using a MOS sensor according to at least one example embodiment.

FIG. 15 illustrates an example of a capsule endoscope 500 employing a MOS sensor 100 according to example embodiments. In the example illustrated in FIG. 15, the capsule endoscope 500 includes a collecting lens 501, LED lighting 503, a supporting board 504, a button battery 505, a wireless interface chip 506, and an antenna 507.

According to example embodiments, the outer shape of the MOS sensor 100 used may be circular, same as the outer shape of the capsule of the endoscope inside which the MOS sensor 100 is located. Consequently, the center position of the optics 502 may be aligned with that of the MOS sensor 100.

Figure 16:
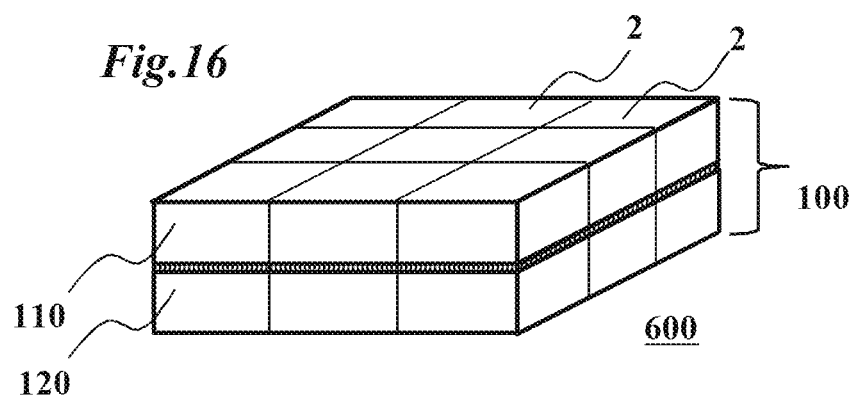
FIG. 16 is a perspective view that schematically illustrates an example of the configuration of a tiling sensor module using plural MOS sensors according to at least one example embodiment.

FIG. 16. illustrates a multifaceted imaging system 600 that combines plural (3 by 3) MOS sensors 100 according to example embodiments. An imaging area of the imaging system 600 may be enlarged with ease by increasing a number of the MOS sensors 10. Further, an outer shape of the imaging system 600 may be flexible depending on an arrangement of the MOS sensors because dead space, either on the MOS sensor 100 or between the MOS sensors, may be reduced or, alternatively, minimized. The multifaceted imaging system 600 is not limited to the configuration illustrated in FIG. 16 and explained above. For example, each MOS sensor 100 may be inserted into the human body separately, and then the plural MOS sensors 100 may be combined to form a multifaceted camera inside the body. The multifaceted camera may allow both a patient and a doctor to view a larger area medical photograph without an abdominal operation.

Applications of the MOS sensor 100 according to example embodiments are not limited to the above mentioned medical endoscopes. For example, the MOS sensor 100 in accordance with example embodiments may be used for any application for which a compact image sensor would be desirable. For example, the MOS sensor 100 may be used in a small portable or wearable system including a digital camera, a mobile phone, and a computer terminal. The MOS sensor 100 according to example embodiments may also be applicable to industrial and consumer equipment including, for example, a surveillance camera, robotics eyes, and various vehicles such as an automobile. The small stacked or three dimensional structure of the MOS sensor is also suitable for artificial retinas and other bioengineering.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed:

1. An image sensor comprising:
a first semiconductor chip having a first surface and a second surface, the first semiconductor chip including an image sensing area, the image sensing area including an array of unit pixels configured to capture light corresponding to an image and to generate image signals based on the captured light, the second surface of the first semiconductor chip including first contact pads connected to the array of unit pixels; and
a second semiconductor chip having a first surface and a second surface, the second semiconductor chip including first peripheral circuits configured to control the array of unit pixels and receive the generated image signals, the first peripheral circuits including a vertical scanning circuit, a horizontal scanning circuit, and a signal read-out circuit, the second surface of the second semiconductor chip including second contact pads connected to the first peripheral circuits,
the first semiconductor chip being stacked on the second semiconductor chip via an adhesive layer such that the second surface of the first semiconductor chip faces the second surface of the second semiconductor chip, the first semiconductor chip not being smaller than the second semiconductor chip, the first contact pads being connected through the adhesive layer to the second contact pads,
the first peripheral circuits being located under the image sensing area with respect to a perspective in which the first semiconductor chip is stacked above the second semiconductor chip,
wherein the vertical scanning circuit and the horizontal scanning circuit each include two longer sides and two shorter sides, and the first peripheral circuits are arranged on the second surface of the second semiconductor device such that the two longer sides of the vertical scanning circuit are parallel to the two longer sides of the horizontal scanning circuit.

2. The image sensor of claim 1, wherein each unit pixel of the array of unit pixels includes,
a light sensitive element on the first surface of the first semiconductor chip, and
a pixel circuit on the second surface of the first semiconductor chip, and
wherein the image sensing area includes,
the light sensitive elements of the array of unit pixels.

3. The image sensor of claim 2, further comprising:
global wiring on the second surface of the first semiconductor device, the global wiring being connected to the pixel circuits of the array of unit pixels; and
a plurality of electrical contact elements in between the second surface of the first semiconductor chip and the second surface of the second semiconductor chip, the global wiring being connected to one or more of the first peripheral circuits via the plurality of electrical contact elements.

4. The image sensor of claim 3, wherein the second semiconductor chip includes plurality of vias, each of the plurality of vias having an opening on the first surface of the second semiconductor chip and corresponding opening on the second surface of the second semiconductor chip, and wherein the image sensor further comprises:
external input and output terminals on the first surface of the second semiconductor chip, the external input and output terminals being connected to one or more of the first peripheral circuits through the plurality of vias formed by the substrate of the second semiconductor chip.

5. The image sensor of claim 4, wherein the plurality of vias, the external input terminals, and the external output terminals are aligned with the image sensing area such that, from a plan perspective, the image sensing area encompasses the plurality of vias, the external input terminals, and the external output terminals.

6. The image sensor of claim 1,
wherein, the image sensor further includes,
global wiring on the second surface of the first semiconductor device, the global wiring being connected to pixel circuits of the array of unit pixels; and
a plurality of electrical contact elements in between the second surface of the first semiconductor chip and the second surface of the second semiconductor chip, the global wiring being connected to one or more of the first peripheral circuits via the plurality of electrical contact elements, and wherein,
the global wiring includes first lines, second lines and third lines,
with respect to a plan perspective view of the image sensor, the first lines intersect at right angles with the second lines,
the second lines are electrically connected to corresponding ones of the third lines, respectively, at right angles,
the second lines are connected to the third lines through one or more contact vias, and
the first lines and the third lines are electrically connected to one or more of the first peripheral circuits.

7. The image sensor of claim 6, wherein the third lines are electrically connected to at least one of the vertical scanning circuit and the signal read-out circuit.

8. The image sensor of claim 6, wherein the first lines are connected to the signal read-out circuit, and the third lines are connected to the vertical scanning circuit.

9. The image sensor of claim 8, wherein, with respect to a plan perspective view of the image sensor, a length of the vertical scanning circuit in a horizontal direction is larger than a length of the image sensing area in a vertical direction.

10. The image sensor of claim 8, wherein the second lines extend from a first edge of the first semiconductor chip to a second edge of the first semiconductor chip along the second surface of the first semiconductor chip.

11. The image sensor of claim 1, wherein the signal read-out circuit is located in a central region of the second semiconductor chip, with respect to a plan perspective view of the second semiconductor chip.

12. The image sensor of claim 1, wherein, with respect to a plan perspective view of the image sensor, a shape of a footprint of the stacked first and second semiconductor chips is at least one of a round shape and a shape of a polygon having more than four sides.

13. The endoscope apparatus of claim 12, further comprising:
a capsule, the image sensor being included inside the capsule.

14. The image sensor of claim 1, further comprising:
a third semiconductor chip, the second semiconductor chip being stacked on the third semiconductor chip, the third semiconductor chip including second peripheral circuits,
wherein the first peripheral circuits on the second surface of the second semiconductor device further include,
a column-based analog-to-digital (AD) converter circuit, and
an interface circuit, and
wherein the second peripheral circuits include,
a timing pulse generator circuit, and
a digital image processing circuit.

15. The image sensor of claim 1, wherein the first semiconductor chip includes first isolation regions and second isolation regions,
the first isolation regions separating unit pixels, from among the array of unit pixels, from one another,
the second isolation regions separating edge unit pixels from edges of the first semiconductor chip,
the edge unit pixels being unit pixels, from among the array of unit pixels, that are located adjacent to at least one of the edges of the first semiconductor chip, and
wherein widths of the second isolation regions are one half of widths of the first isolation regions.

16. The image sensor of claim 1, wherein the array of unit pixels is arranged such that a center of the array of unit pixels is aligned with a center of the first semiconductor chip.

17. The image sensor of claim 1, wherein a footprint the second semiconductor chip is the same as a footprint the first semiconductor chip, with respect to a plan perspective view of the image sensor.

18. An endoscope apparatus comprising:
the image sensor of claim 1.

19. A multifaceted imaging apparatus comprising:
a plurality of image sensors according to claim 1.

20. An image sensor comprising:
a first semiconductor chip having a first surface and a second surface, the first semiconductor chip including an image sensing area, the image sensing area including an array of unit pixels configured to capture light corresponding to an image and to generate image signals based on the captured light, the second surface of the first semiconductor chip including first contact pads connected to the array of unit pixels; and
a second semiconductor chip having a first surface and a second surface, the second semiconductor chip including first peripheral circuits configured to control the array of unit pixels and receive the generated image signals, the first peripheral circuits including a vertical scanning circuit, a horizontal scanning circuit, and a signal read-out circuit, the second surface of the second semiconductor chip including second contact pads connected to the first peripheral circuits,
the first semiconductor chip being stacked on the second semiconductor chip via an adhesive layer such that the second surface of the first semiconductor chip faces the second surface of the second semiconductor chip, the first semiconductor chip not being smaller than the second semiconductor chip, the first contact pads being connected through the adhesive layer to the second contact pads,
wherein each unit pixel of the array of unit pixels includes,
a light sensitive element on the first surface of the first semiconductor chip, and a pixel circuit on the second surface of the first semiconductor chip, and wherein the image sensing area includes, the light sensitive elements of the array of unit pixels.

21. An image sensor comprising:

a first semiconductor chip having a first surface and a second surface, the first semiconductor chip including an image sensing area, the image sensing area including an array of unit pixels configured to capture light corresponding to an image and to generate image signals based on the captured light, the second surface of the first semiconductor chip including first contact pads connected to the array of unit pixels; and a second semiconductor chip having a first surface and a second surface, the second semiconductor chip including first peripheral circuits configured to control the array of unit pixels and receive the generated image signals, the first peripheral circuits including a vertical scanning circuit, a horizontal scanning circuit, and a signal read-out circuit, the second surface of the second semiconductor chip including second contact pads connected to the first peripheral circuits, the first semiconductor chip being stacked on the second semiconductor chip via an adhesive layer such that the second surface of the first semiconductor chip faces the second surface of the second semiconductor chip, the first semiconductor chip not being smaller than the second semiconductor chip, the first contact pads being connected through the adhesive layer to the second contact pads, wherein the vertical scanning circuit and the horizontal scanning circuit each include two longer sides and two shorter sides, and the first peripheral circuits are arranged on the second surface of the second semiconductor device such that the two longer sides of the vertical scanning circuit are parallel to the two longer sides of the horizontal scanning circuit.

22. The image sensor of claim 21, further comprising:

a third semiconductor chip, the second semiconductor chip being stacked on the third semiconductor chip, the third semiconductor chip including second peripheral circuits, wherein the first peripheral circuits on the second surface of the second semiconductor device further include, a column-based analog-to-digital (AD) converter circuit, and an interface circuit, and wherein the second peripheral circuits include, a timing pulse generator circuit, and a digital image processing circuit.

* * * * *